United States Patent
Yamazaki et al.

(10) Patent No.: US 9,136,388 B2
(45) Date of Patent: Sep. 15, 2015

(54) SEMICONDUCTOR DEVICE

(75) Inventors: Shunpei Yamazaki, Setagaya (JP); Masahiro Takahashi, Atsugi (JP); Tatsuya Honda, Isehara (JP); Takehisa Hatano, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 316 days.

(21) Appl. No.: 13/549,867

(22) Filed: Jul. 16, 2012

(65) Prior Publication Data

US 2013/0020571 A1 Jan. 24, 2013

(30) Foreign Application Priority Data

Jul. 22, 2011 (JP) ................. 2011-161383

(51) Int. Cl.
  *H01L 29/26* (2006.01)
  *H01L 29/786* (2006.01)
(52) U.S. Cl.
  CPC ...... *H01L 29/78618* (2013.01); *H01L 29/7869* (2013.01)
(58) Field of Classification Search
  None
  See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Tan N Tran
*Assistant Examiner* — Scott R Wilson
(74) *Attorney, Agent, or Firm* — Eric J. Robinson; Robinson Intellectual Property Law Office, P.C.

(57) ABSTRACT

Provided is a structure of a transistor, which enables a so-called normally-off switching element, and a manufacturing method thereof. Provided is a structure of a semiconductor device which achieves high-speed response and high-speed operation by improving on characteristics of a transistor, and a manufacturing method thereof. Provided is a highly reliable semiconductor device. In the transistor in which a semiconductor layer, source and drain electrode layers, a gate insulating layer, and a gate electrode layer are stacked in that order. As the semiconductor layer, an oxide semiconductor layer which contains at least four kinds of elements of indium, gallium, zinc, and oxygen, and has a composition ratio (atomic percentage) of indium as twice or more as a composition ratio of gallium and a composition ratio of zinc, is used.

17 Claims, 17 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,319,269 B2 * | 11/2012 | Ieda .............................. 257/316 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 * | 11/2003 | Wager et al. .................. 257/410 |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 * | 3/2008 | Iwasaki ........................... 257/79 |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025676 A1 * | 2/2010 | Yamazaki et al. .............. 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0156024 A1 * | 6/2011 | Koyama et al. ................. 257/43 |
| 2011/0215328 A1 * | 9/2011 | Morosawa et al. ............. 257/59 |
| 2012/0002090 A1 * | 1/2012 | Aoki et al. ..................... 348/297 |
| 2012/0315730 A1 | 12/2012 | Koezuka et al. |
| 2012/0315735 A1 | 12/2012 | Koezuka et al. |
| 2012/0319114 A1 | 12/2012 | Yamazaki et al. |
| 2013/0009209 A1 | 1/2013 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on ElectronDevices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett (Applied Physics Letters), Sep. 27, 2004, vol. 85, No. 13, pp. 2541-2543.

(56) References Cited

OTHER PUBLICATIONS

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O Tfts", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al. "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the IN2O3 and SC2O3—A2O3—BO Systems [A; Fe, Ga or Al; B; Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8 , 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S at al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID

(56) References Cited

OTHER PUBLICATIONS

Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)m$ (m <4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al,, "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J at al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K at al., "42.4L: Late-News Paper: 4 Inch QVGA AMOLED Driven by the Threshold Voltage Controlled Amorphous GIZO ($Ga_2O_3$-$In_2O_3$-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle,C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

SEMICONDUCTOR DEVICE

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and electronic equipment are all semiconductor devices.

2. Description of the Related Art

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide containing indium (In), gallium (Ga), and zinc (Zn) is disclosed (see Patent Document 1).

REFERENCE

Patent Document

[Patent Document 1] Japanese Published Patent Application No. 2006-165528

SUMMARY OF THE INVENTION

One object of the present invention is to provide a structure of a transistor including an oxide semiconductor in a channel formation region in which the threshold voltage of electric characteristics of the transistor can be positive, which is a so-called normally-off switching element, and a manufacturing method thereof.

Further, another object of one embodiment of the present invention is to provide a structure of a semiconductor device which achieves high-speed response and high-speed operation by improving on characteristics of a transistor (e.g., on-state current or field-effect mobility), and to provide a manufacturing method thereof, in order to achieve a high-performance semiconductor device.

Further, another object is to provide a semiconductor device in which reliability is high and threshold voltage does not easily shift even in a long-time use.

It is an object of one embodiment of the present invention to achieve at least one of the above-described objects.

In a transistor in which a semiconductor layer, source and drain electrode layers, a gate insulating layer, and a gate electrode layer are stacked in that order. As the semiconductor layer, an oxide semiconductor layer which contains at least four kinds of elements of indium, gallium, zinc, and oxygen, and has a composition ratio (atomic percentage) of indium as twice or more as a composition ratio of gallium and a composition ratio of zinc, is used.

One embodiment of the present invention disclosed in this specification is a semiconductor device including an oxide semiconductor layer including a channel formation region over an oxide insulating layer, a gate insulating film over the oxide semiconductor layer, and a gate electrode layer overlapping with the oxide semiconductor layer over the gate insulating film. The oxide semiconductor layer contains at least four kinds of elements of indium, gallium, zinc, and oxygen, and has a composition ratio (atomic percentage) of indium as twice or more as a composition ratio of gallium and a composition ratio of zinc.

One embodiment of the present invention disclosed in this specification is a semiconductor device including an oxide semiconductor layer including a channel formation region over an oxide insulating layer, a source electrode layer and a drain electrode layer over the oxide semiconductor layer, a gate insulating film over the source electrode layer and the drain electrode layer, and a gate electrode layer overlapping with the oxide semiconductor layer over the gate insulating film. The oxide semiconductor layer contains at least four kinds of elements of indium, gallium, zinc, and oxygen, and has a composition ratio (atomic percentage) of indium as twice or more as a composition ratio of gallium and a composition ratio of zinc.

One embodiment of the present invention disclosed in this specification is a semiconductor device including a pair of first oxide semiconductor layers separated from each other over an oxide insulating layer, a second oxide semiconductor layer including a channel formation region on and in contact with the oxide insulating layer and the pair of first oxide semiconductor layers, a gate insulating film over the oxide insulating layer and the second oxide semiconductor layer, and a gate electrode layer overlapping with the second oxide semiconductor layer over the gate insulating film. The second oxide semiconductor layer contains at least four kinds of elements of indium, gallium, zinc, and oxygen, and has a composition ratio (atomic percentage) of indium as twice or more as a composition ratio of gallium and a composition ratio of zinc.

The oxide semiconductor layer or the second oxide semiconductor layer is a non-single crystal semiconductor, and may include a c-axis-aligned crystal region.

The oxide semiconductor layer or the second oxide semiconductor layer is a non-single crystal semiconductor, and can be formed with an oxide target having a composition ratio of indium:gallium:zinc=3:1:2.

In the oxide semiconductor layer or the second oxide semiconductor layer, a region which does not overlap with the gate electrode layer may include a dopant.

In the oxide semiconductor layer or the second oxide semiconductor layer, a region which does not overlap with the source electrode layer or the drain electrode layer may have a higher oxygen concentration than a region which overlaps with the source electrode layer or the drain electrode layer.

Low-resistance regions whose resistances are lower than that of the channel formation region and which include a dopant may be formed in the oxide semiconductor layer so that the channel formation region is sandwiched between the low-resistance regions, by introducing the dopant into the oxide semiconductor layer in a self-aligning manner with the use of the gate electrode layer as a mask. The dopant is an impurity by which the electrical conductivity of the oxide semiconductor layer is changed. As the method for introducing the dopant, an ion implantation method, an ion doping method, a plasma immersion ion implantation method, or the like can be used.

With an oxide semiconductor layer which includes low-resistance regions between which a channel formation region is sandwiched in the channel length direction, the transistor has excellent on-state characteristics (e.g., on-state current and field-effect mobility) and enables high-speed operation and high-speed response.

Further, heat treatment (dehydration or dehydrogenation treatment) by which hydrogen or moisture is released may be performed on the oxide semiconductor layer. When a crystalline oxide semiconductor layer is used as the oxide semiconductor layer, heat treatment for crystallization may be performed.

Through the dehydration or dehydrogenation treatment, oxygen that is a main component material of an oxide semiconductor might be detached and thus might be reduced. There is an oxygen defect in a portion where oxygen is detached in the oxide semiconductor film and a donor level which leads to variation in the electric characteristics of a transistor is formed owing to the oxygen defect.

Thus, oxygen is preferably supplied to the oxide semiconductor layer after being subjected to the dehydration or dehydrogenation treatment. By supplying oxygen to the stack of oxide semiconductor layers, oxygen defects in the film can be repaired.

For example, an oxide insulating film including much (excessive) oxygen, which serves as an oxygen supply source, may be provided so as to be in contact with the oxide semiconductor layer, whereby oxygen can be supplied to the oxide semiconductor layer from the oxide insulating film. In the above structure, heat treatment may be performed as dehydration or dehydrogenation treatment in the state where the oxide semiconductor layer and the oxide insulating film are in contact with each other at least partly to supply oxygen to the oxide semiconductor layer.

Further or alternatively, oxygen (which includes at least one of an oxygen radical, an oxygen atom, and an oxygen ion) may be added to the oxide semiconductor layer after being subjected to the dehydration or dehydrogenation treatment to supply oxygen to the oxide semiconductor layer. As a method for introducing oxygen, an ion implantation method, an ion doping method, a plasma immersion ion implantation method, plasma treatment, or the like may be used.

Further, it is preferable that the oxide semiconductor layer in a transistor include a region where the oxygen content is higher than that in the stoichiometric composition of the oxide semiconductor in a crystalline state. In that case, the oxygen content is higher than that in the stoichiometric composition ratio of the oxide semiconductor. Alternatively, the oxygen content is higher than that of the oxide semiconductor in a single crystal state. In some cases, oxygen exists between lattices of the oxide semiconductor.

By removing hydrogen or moisture from the oxide semiconductor to highly purify the oxide semiconductor so as not to contain impurities as much as possible, and supplying oxygen to repair oxygen vacancies therein, the oxide semiconductor can be turned into an i-type (intrinsic) oxide semiconductor or a substantially i-type (intrinsic) oxide semiconductor. This enables the Fermi level ($E_f$) of the oxide semiconductor to be at the same level as the intrinsic Fermi level ($E_i$). Accordingly, by using the oxide semiconductor layer for a transistor, fluctuation in the threshold voltage Vth of the transistor due to an oxygen vacancy and a shift of the threshold voltage ΔVth can be reduced.

One embodiment of the present invention relates to a semiconductor device including a transistor or a semiconductor device including a circuit which is formed by using a transistor. For example, one embodiment of the present invention relates to a semiconductor device including a transistor in which a channel formation region is formed using an oxide semiconductor or a semiconductor device including a circuit which is formed by using such a transistor. For example, the present invention relates to an electronic device which includes, as a component, an LSI; a CPU; a power device mounted in a power circuit; a semiconductor integrated circuit including a memory, a thyristor, a converter, an image sensor, or the like; an electro-optical device typified by a liquid crystal display panel; or a light-emitting display device including a light-emitting element.

According to one embodiment of the present invention, a structure of a transistor including an oxide semiconductor in a channel formation region in which the threshold voltage of electric characteristics of the transistor can be positive, which is a so-called normally-off switching element, and a manufacturing method thereof can be provided.

Further, according to one embodiment of the present invention, in order to achieve a semiconductor device having higher performance, a structure for improving on-state characteristics of the transistor (e.g., on-state current and field-effect mobility) and for achieving high-speed response and high-speed operation of the semiconductor device and a manufacturing method thereof can be provided.

Further, according to one embodiment of the present invention, a semiconductor device in which reliability is high and threshold voltage does not easily shift even in a long-time use can be provided.

DETAILED DESCRIPTION OF THE INVENTION

Figure 1A:
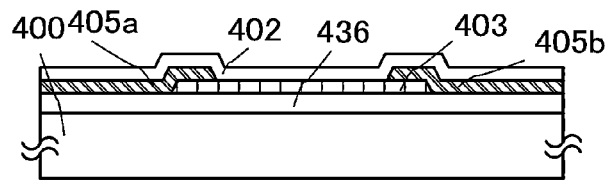
FIGS. 1A to 1E are diagrams showing one embodiment of a semiconductor device and a method for manufacturing the semiconductor device.

Hereinafter, embodiments of the invention disclosed in this specification are described with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

In this embodiment, one embodiment of a semiconductor device and a method for manufacturing the semiconductor device are described with reference to FIGS. 1A to 1E and FIGS. 3A to 3C. In this embodiment, a transistor including an oxide semiconductor film is described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned over and under a channel formation region with a gate insulating film provided therebetween.

A transistor 440a shown in FIGS. 1A to 1E is an example of a planar type transistor having a top-gate structure.

The transistor 440a includes, over a substrate 400 having an insulating surface over which an oxide insulating layer 436 is provided, an oxide semiconductor layer 403 including a channel formation region 409, low-resistance regions 404a and 404b, and low-resistance regions 406a and 406b, a source electrode layer 405a, a drain electrode layer 405b, a gate insulating film 402, and a gate electrode layer 401. An insulating film 407 is formed over the transistor 440a.

Figure 1B:
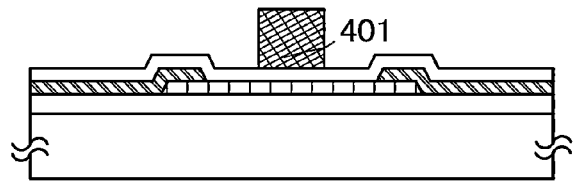
Figure 1C:
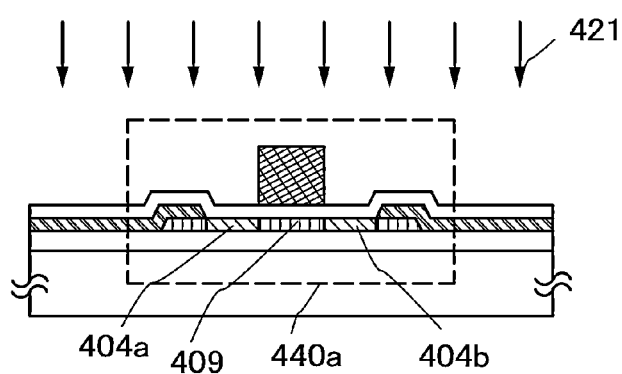
Figure 1D:
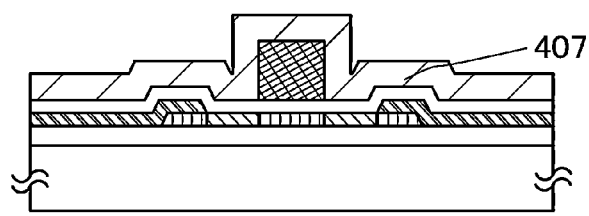
Figure 1E:
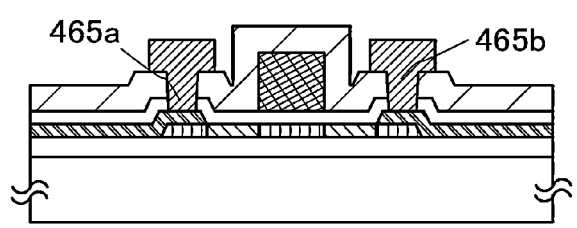
Figure 2A:
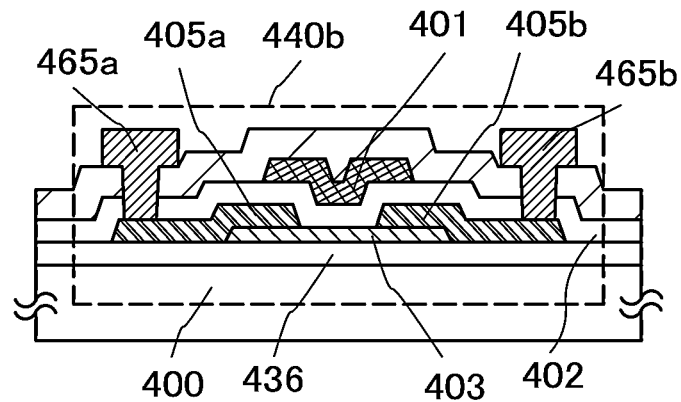
FIGS. 2A to 2C are diagrams showing one embodiment of a semiconductor device.

In FIGS. 1A to 1E, the source electrode layer 405a and the drain electrode layer 405b are not overlapped with the gate electrode layer 401, over the oxide semiconductor layer 403; however, the source electrode layer 405a and the drain electrode layer 405b may be partly overlapped with the gate electrode layer 401 like a transistor 440b shown in FIG. 2A.

The oxide semiconductor layer 403 is an oxide semiconductor layer (also referred to as an IGZO layer) which contains at least four kinds of elements of indium, gallium, zinc, and oxygen, and has a composition ratio (atomic percentage) of indium as twice or more as a composition ratio of gallium and a composition ratio of zinc.

The oxide semiconductor layer 403 can be formed by a sputtering method with an oxide target having a composition ratio of indium:gallium:zinc=3:1:2.

The oxide semiconductor is non-single-crystal and may be either amorphous or polycrystalline. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, more preferably less than or equal to 0.1 nm.

Note that the average surface roughness ($R_a$) is obtained by expanding, into three dimensions, arithmetic mean surface roughness that is defined by JIS B 0601: 2001 (ISO4287: 1997) so as to be able to apply it to a curved surface. $R_a$ can be expressed as an "average value of the absolute values of deviations from a reference surface to a designated surface" and is defined by the following formula 1.

$$Ra = \frac{1}{S_0} \int_{y_1}^{y_2} \int_{x_1}^{x_2} |f(x, y) - Z_0| \, dx \, dy \quad \text{[FORMULA 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). $S_0$ represents the area of a rectangle which is obtained by projecting the specific surface on the xy plane, and $Z_0$ represents the height of the reference surface (the average height of the specific surface). Ra can be measured using an atomic force microscope (AFM).

As the oxide semiconductor layer 403, an oxide semiconductor layer including a crystal and having crystallinity (crystalline oxide semiconductor layer) can be used. The crystals in the crystalline oxide semiconductor layer may have crystal axes oriented in random directions or in a certain direction.

For example, an oxide semiconductor layer including a crystal having a c-axis which is substantially perpendicular to a surface of the oxide semiconductor film can be used as the crystalline oxide semiconductor layer.

The oxide semiconductor layer including a crystal having a c-axis substantially perpendicular to a surface has neither single crystal structure nor amorphous structure and is an oxide semiconductor layer including a c-axis aligned crystal (also referred to as CAAC), i.e., a CAAC-OS layer.

CAAC is a c-axis aligned crystal which has a triangular or hexagonal atomic arrangement when seen from the direction of an a-b plane, a surface, or an interface and in which metal atoms are arranged in a layered manner, or metal atoms and oxygen atoms are arranged in a layered manner along a c-axis, and the direction of the a-axis or the b-axis is varied in the a-b plane (or the surface or the interface), that is, which rotates around the c-axis. A thin film including CAAC is crystallized along the c-axis but alignment along the a-b planes does not necessarily appear.

The CAAC is, in a broad sense, non-single-crystal including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

A film including CAAC is not a single crystal, but this does not mean that the CAAC film is composed of only an amorphous component. Although the CAAC film includes a crystallized portion (crystalline portion), a boundary between one crystalline portion and another crystalline portion is not clear in some cases.

Nitrogen may be substituted for part of oxygen included in the CAAC. The c-axes of individual crystalline portions included in the CAAC film may be aligned in one direction (e.g., the direction perpendicular to a surface of a substrate over which the CAAC film is formed, a surface of the CAAC film, or an interface of the CAAC film). Alternatively, normals of the a-b planes of individual crystalline portions included in the CAAC film may be aligned in one direction (e.g., the direction perpendicular to a surface of a substrate over which the CAAC film is formed, a surface of the CAAC film, an interface of the CAAC film, or the like).

The crystalline oxide semiconductor layer enables a change of electric characteristics of the transistor due to irradiation with visible light or ultraviolet light to be further suppressed, leading to a highly reliable semiconductor device.

There are three methods for obtaining a crystalline oxide semiconductor layer having c-axis alignment. The first is a method in which an oxide semiconductor layer is deposited at a temperature higher than or equal to 200° C. and lower than or equal to 500° C. such that the c-axis is substantially perpendicular to the top surface. The second is a method in which an oxide semiconductor layer is deposited thin, and is subjected to heat treatment at a temperature(s) higher than or equal to 200° C. and lower than or equal to 700° C., so that the c-axis is substantially perpendicular to the top surface. The third is a method in which a first-layer oxide semiconductor layer is deposited thin, and is subjected to heat treatment at a temperature(s) higher than or equal to 200° C. and lower than or equal to 700° C., and a second-layer oxide semiconductor layer is deposited thereover, so that the c-axis is substantially perpendicular to the top surface.

The oxide semiconductor layer 403 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulse laser deposition method, an atomic layer deposition (ALD) method, or the like as appropriate. The oxide semiconductor layer 403 may be formed with a sputtering apparatus which performs deposition in the state where top surfaces of a plurality of substrates are substantially perpendicular to a top surface of a sputtering target.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

FIGS. 1A to 1E illustrate an example of a method for manufacturing the transistor 440a.

First, the oxide insulating layer 436 is formed over the substrate 400 having an insulating surface.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400, or the substrate provided with a semiconductor element can be used as the substrate 400.

The semiconductor device may be manufactured using a flexible substrate as the substrate 400. To manufacture a flexible semiconductor device, the transistor 440a including the oxide semiconductor layer 403 may be directly formed over a flexible substrate; or alternatively, the transistor 440a including the oxide semiconductor layer 403 may be formed over a substrate, and then may be separated and transferred to a flexible substrate. Note that in order to separate the transistor 440a from the manufacturing substrate and transfer it to the flexible substrate, a separation layer may be provided between the manufacturing substrate and the transistor 440a including the oxide semiconductor film.

The oxide insulating layer 436 can be formed by a plasma CVD method, a sputtering method, or the like using any of silicon oxide, silicon oxynitride, aluminum oxide, aluminum oxynitride, hafnium oxide, gallium oxide, silicon nitride oxide, and aluminum nitride oxide, or a mixed material thereof.

The oxide insulating layer 436 may be either a single layer or a stacked layer. For example, a silicon oxide film, an In—Hf—Zn-based oxide film, and the oxide semiconductor layer 403 may be stacked in that order over the substrate 400; a silicon oxide film, an In—Zr—Zn-based oxide film with an atomic ratio of In:Zr:Zn=1:1:1, and the oxide semiconductor layer 403 may be stacked in that order over the substrate 400; or a silicon oxide film, an In—Gd—Zn-based oxide film with an atomic ratio of In:Gd:Zn=1:1:1, and the oxide semiconductor layer 403 may be stacked in that order over the substrate 400.

A silicon oxide film is formed by a sputtering method as the oxide insulating layer 436 in this embodiment.

Further, a nitride insulating film may be provided between the oxide insulating layer 436 and the substrate 400. The nitride insulating film can be formed using any of silicon nitride, silicon nitride oxide, aluminum nitride, aluminum nitride oxide, or a mixed material of any of these, by a plasma CVD method, a sputtering method, or the like.

Next, the oxide semiconductor layer 403 is formed over the oxide insulating layer 436.

The oxide insulating layer 436, which is in contact with the oxide semiconductor layer 403, preferably contains oxygen which exceeds at least the stoichiometric composition ratio in the film (the bulk). For example, in the case where a silicon oxide film is used as the oxide insulating layer 436, the composition formula is $SiO_{2+\alpha}$ ($\alpha>0$). By using such a film as the oxide insulating layer 436, oxygen can be supplied to the oxide semiconductor layer 403, leading to favorable characteristics. By a supply of oxygen to the oxide semiconductor layer 403, oxygen vacancies in the film can be repaired.

For example, when the oxide insulating layer 436 containing much (excessive) oxygen, which serves as an oxygen supply source, is provided so as to be in contact with the oxide semiconductor layer 403, oxygen can be supplied from the oxide insulating layer 436 to the oxide semiconductor layer 403. Heat treatment may be performed in the state where the oxide semiconductor layer 403 and the oxide insulating layer 436 are in contact with each other at least partly to supply oxygen to the oxide semiconductor layer 403.

In order that hydrogen or water will be not contained in the oxide semiconductor layer 403 as much as possible in the formation step of the oxide semiconductor layer 403, it is preferable to heat the substrate provided with the oxide insulating layer 436 in a preheating chamber in a sputtering apparatus as a pretreatment for formation of the oxide semiconductor layer 403 so that impurities such as hydrogen and moisture adsorbed to the substrate and/or the oxide insulating layer 436 are eliminated and evacuated. As an exhaustion unit provided in the preheating chamber, a cryopump is preferable.

Therefore, planarizing treatment may be performed on the region of the oxide insulating layer 436 which is in contact with the oxide semiconductor layer 403. The planarization treatment may be, but not particularly limited to, polishing treatment (such as chemical mechanical polishing (CMP)), dry etching treatment, or plasma treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the top surface of the oxide insulating layer 436.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the oxide insulating layer 436.

The oxide semiconductor layer 403 is preferably deposited under a condition such that much oxygen is contained (for example, by a sputtering method in an atmosphere where the proportion of oxygen is 100%) so as to be a film containing much oxygen (preferably having a region containing an excess of oxygen as compared to the stoichiometric composition ratio of the oxide semiconductor in a crystalline state).

Note that in this embodiment, a target used for forming the oxide semiconductor layer 403 by a sputtering method is, for example, an oxide target having a composition ratio of In:Ga:Zn=3:1:2 [atomic percentage], so that an In—Ga—Zn-based oxide film (IGZO film) is formed.

The relative density (the fill rate) of the metal oxide target is 90% to 100% inclusive, preferably 95% to 99.9% inclusive. By using the metal oxide target with high relative density, a dense oxide semiconductor film can be formed.

It is preferable to use a high-purity gas from which impurities such as hydrogen, water, a hydroxyl group, or hydride are removed as a sputtering gas used when the oxide semiconductor layer 403 is formed.

The substrate is held in a film formation chamber kept under reduced pressure. Then, a sputtering gas from which hydrogen and moisture are removed is introduced while residual moisture in the film formation chamber is removed, and the oxide semiconductor layer 403 is formed over the substrate 400 using the above target. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is evacuated with an entrapment vacuum pump such as a cryopump, a hydrogen atom, a compound containing a hydrogen atom such as water ($H_2O$) (more preferably, also a compound containing a carbon atom), and the like are removed, whereby the impurity concentration in the oxide semiconductor layer 403 formed in the deposition chamber can be reduced.

The oxide insulating layer 436 and the oxide semiconductor layer 403 are preferably formed in succession without exposure to the air. According to successive formation of the oxide insulating layer 436 and the oxide semiconductor layer 403 without exposure to the air, impurities such as hydrogen and moisture can be prevented from being adsorbed onto a surface of the oxide insulating layer 436.

The oxide semiconductor layer 403 can be formed by processing an oxide semiconductor film into an island shape by a photolithography process.

Further, a resist mask for forming the island-shaped oxide semiconductor layer 403 may be formed by an inkjet method. Formation of the resist mask by an inkjet method needs no photomask; thus, manufacturing cost can be reduced.

Note that the etching of the oxide semiconductor film may be dry etching, wet etching, or both dry etching and wet etching. As an etchant used for wet etching of the oxide semiconductor film, for example, a mixed solution of phosphoric acid, acetic acid, and nitric acid, or the like can be used. In addition, ITO07N (produced by KANTO CHEMICAL CO., INC.) may also be used.

Further, heat treatment may be performed on the oxide semiconductor layer 403 in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate is put in an electric furnace which is a kind of heat treatment apparatus, and the oxide semiconductor layer 403 is subjected to the heat treatment at 450° C. for an hour in a nitrogen atmosphere.

Further, a heat treatment apparatus used is not limited to an electric furnace, and a device for heating a process object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Note that in heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, far preferably 7N (99.99999%) or higher (that is, the impurity concentration is preferably 1 ppm or lower, far preferably 0.1 ppm or lower).

In addition, after the oxide semiconductor layer 403 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb, in the measurement with the use of a dew point meter of a cavity ring down laser spectroscopy (CRDS) system) may be introduced into the same furnace. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or more, far preferably 7N or more (i.e., the impurity concentration in the oxygen gas or the dinitrogen monoxide gas is preferably 1 ppm or lower, far preferably 0.1 ppm or lower). The oxygen gas or the dinitrogen monoxide gas acts to supply oxygen that is a main component of the oxide semiconductor and that is reduced by the step for removing an impurity for the dehydration or dehydrogenation, so that the oxide semiconductor layer 403 can be a high-purified, i-type (intrinsic) oxide semiconductor film.

Note that the heat treatment for dehydration or dehydrogenation can be performed in the process of manufacturing the transistor 440a anytime after formation of the oxide semiconductor film which has not been processed into the oxide semiconductor layer 403 and before formation of the insulating film 407. For example, the heat treatment may be performed after formation of the oxide semiconductor film or after formation of the island-shaped oxide semiconductor layer 403.

Further, the heat treatment for dehydration or dehydrogenation may be performed more than once or may be combined with another heat treatment.

When the heat treatment for dehydration or dehydrogenation is performed in the state where the oxide insulating layer 436 is covered with the oxide semiconductor film which has not been processed into the island-shaped oxide semiconductor layer 403, oxygen contained in the oxide insulating layer 436 can be prevented from being released by the heat treatment, which is preferable.

Further or alternatively, oxygen (which includes at least one of an oxygen radical, an oxygen atom, and an oxygen ion) may be added to the oxide semiconductor layer after being subjected to the dehydration or dehydrogenation treatment to supply oxygen to the oxide semiconductor layer.

Oxygen which is added to the dehydrated or dehydrogenated oxide semiconductor layer 403 to supply oxygen to the film can highly purify the oxide semiconductor layer 403 and make the film an i-type (intrinsic). Variation in electric characteristics of a transistor having a highly-purified and i-type (intrinsic) oxide semiconductor layer 403 is suppressed, and the transistor is electrically stable.

As a method for introducing oxygen, an ion implantation method, an ion doping method, a plasma immersion ion implantation method, plasma treatment, or the like may be used.

In the step of addition of oxygen, oxygen may be directly added to the oxide semiconductor layer 403 or added to the oxide semiconductor layer 403 through another film such as the gate insulating film 402 or the insulating film 407. An ion implantation method, an ion doping method, a plasma immersion ion implantation method, or the like may be employed for the addition of oxygen through another film, whereas plasma treatment or the like can also be employed for the addition of oxygen directly into an exposed oxide semiconductor layer 403.

As described above, the addition of oxygen into the oxide semiconductor layer 403 can be performed anytime after dehydration or dehydrogenation treatment is performed thereon. Further, oxygen may be added plural times into the dehydrated or dehydrogenated oxide semiconductor layer 403.

Next, a conductive film to be a source electrode layer and a drain electrode layer (including a wiring formed in the same layer as the source electrode layer and the drain electrode layer) is formed over the oxide semiconductor layer 403. The conductive film is formed using a material that can withstand heat treatment in a later step. As a conductive film used for the source electrode layer and the drain electrode layer, for example, a metal film containing an element selected from Al, Cr, Cu, Ta, Ti, Mo, and W and a metal nitride film containing any of the above elements as its main component (a titanium nitride film, a molybdenum nitride film, and a tungsten nitride film) can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

Through a photolithography process, a resist mask is formed over the conductive film, and selective etching is performed thereon, so that the source electrode layer 405a and the drain electrode layer 405b are formed, and then, the resist mask is removed.

Next, the gate insulating film 402 covering the oxide semiconductor layer 403, the source electrode layer 405a, and the drain electrode layer 405b is formed (see FIG. 1A).

To improve the coverage with the gate insulating film 402, the above-described planarizing treatment may be performed also on the top surface of the oxide semiconductor layer 403, and top surfaces of the source electrode layer 405a and the drain electrode layer 405b. It is preferable that the flatness of the top surface of the oxide semiconductor layer 403 and the top surfaces of the source electrode layer 405a and the drain electrode layer 405b be good particularly when the thickness of the gate insulating film 402 is small.

The gate insulating film 402 can be formed to have a thickness greater than or equal to 1 nm and less than or equal to 20 nm by a sputtering method, an MBE method, a CVD method, a pulse laser deposition method, an ALD method, or the like as appropriate. Alternatively, the gate insulating film 402 may be formed with a sputtering apparatus where film formation is performed with surfaces of a plurality of substrates set substantially perpendicular to a surface of a sputtering target.

The gate insulating film 402 can be formed using a silicon oxide film, a gallium oxide film, an aluminum oxide film, a silicon nitride film, a silicon oxynitride film, an aluminum oxynitride film, or a silicon nitride oxide film. It is preferable that the gate insulating film 402 include oxygen in a portion which is in contact with the oxide semiconductor layer 403. In particular, the gate insulating film 402 preferably contains a large amount of oxygen which exceeds at least the stoichiometric ratio in (a bulk of) the film. For example, in the case where a silicon oxide film is used as the gate insulating film 402, the composition formula is $SiO_{2+\alpha}$ ($\alpha>0$). In this embodiment, a silicon oxide film of $SiO_{2+\alpha}$ ($\alpha>0$) is used as the gate insulating film 402. By using the silicon oxide film as the gate insulating film 402, oxygen can be supplied to the oxide semiconductor layer 403, leading to good characteristics. Further, the gate insulating film 402 is preferably formed in consideration of the size of a transistor to be formed and the step coverage with the gate insulating film 402.

When the gate insulating film 402 is formed using a high-k material such as hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)), or lanthanum oxide, gate leakage current can be reduced. Further, the gate insulating film 402 may have either a single-layer structure or a stacked-layer structure.

Then, the gate electrode layer 401 is formed over the gate insulating film 402 by a plasma CVD method, a sputtering method, or the like (see FIG. 1B). The gate electrode layer 401 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 401. The gate electrode layer 401 may have a single-layer structure or a stacked-layer structure.

The gate electrode layer 401 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 401 has a stacked structure of the above conductive material and the above metal material.

As one layer of the gate electrode layer 401 which is in contact with the gate insulating film 402, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function higher than or equal to 5 eV, preferably higher than or equal to 5.5 eV; thus, when these are used as the gate electrode layer, the threshold voltage of the electric characteristics of the transistor can be positive. Accordingly, a so-called normally-off switching element can be provided.

Next, a dopant 421 is introduced into the oxide semiconductor layer 403 with the use of the gate electrode layer 401, the source electrode layer 405a, and the drain electrode layer 405b as masks, whereby the low-resistance regions 404a and 404b are formed.

The dopant 421 is not added to the oxide semiconductor layer 403 in the regions under the source electrode layer 405a and the drain electrode layer 405b in some cases, or the dopant 421 is added to the oxide semiconductor layer 403 in the regions under the source electrode layer 405a and the drain electrode layer 405b such that the dopant concentration in each region is lower and the resistance in each region is higher than that of the other region in some cases, depending on the thickness of each of the source electrode layer 405a and the drain electrode layer 405b and the condition of addition of the dopant 421.

Figure 2B:
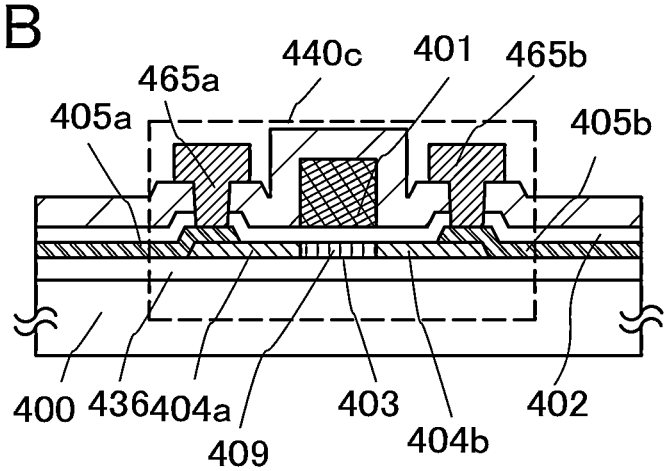

In a transistor 440c in FIG. 2B, a tungsten film with small thickness, for example 10 nm, is formed as the source electrode layer 405a and the drain electrode layer 405b. Owing to the above-described small thickness of each of the source electrode layer 405a and the drain electrode layer 405b, when a dopant is introduced into the oxide semiconductor layer 403 to form low-resistance regions, the dopant can also be introduced into the oxide semiconductor layer 403 which is below the source electrode layer 405a and the drain electrode layer 405b, through the source electrode layer 405a and the drain electrode layer 405b. As a result, in the transistor 440c, the low-resistance regions 404a and 404b are formed in the oxide semiconductor layer 403 which is below the source electrode layer 405a and the drain electrode layer 405b.

The dopant 421 is an impurity by which the electrical conductivity of the oxide semiconductor layer 403 is changed. One or more selected from the following can be used as the dopant 421: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

The dopant 421 can be introduced into the oxide semiconductor layer 403 through other films (e.g., the insulating film 407, the source electrode layer 405a, and the drain electrode layer 405b) by an implantation method. As the method for introducing the dopant 421, an ion implantation method, an ion doping method, a plasma immersion ion implantation method, or the like can be used. In the case where the above method is used, it is preferable to use a single ion of the dopant 421, a fluoride ion, or a chloride ion.

The introduction of the dopant 421 may be controlled by setting the addition conditions such as the accelerated voltage and the dosage, or the thickness of the films through which the dopant passes as appropriate. In this embodiment, boron is used as the dopant 421, whose ion is introduced by an ion implantation method. The dosage is preferably set to be greater than or equal to $1\times10^{13}$ ions/cm$^2$ and less than or equal to $5\times10^{16}$ ions/cm$^2$.

The concentration of the dopant 421 in the low-resistance region is preferably greater than or equal to $5\times10^{18}$/cm$^3$ and less than or equal to $1\times10^{22}$/cm$^3$.

The dopant 421 may be introduced while the substrate 400 is heated.

The introduction of the dopant 421 into the oxide semiconductor layer 403 may be performed plural times, and the number of kinds of dopant may be plural.

Further, heat treatment may be performed thereon after the introduction of the dopant 421. The heat treatment is preferably performed at a temperature(s) higher than or equal to 300° C. and lower than or equal to 700° C. (further preferably higher than or equal to 300° C. and lower than or equal to 450° C.) for one hour under an oxygen atmosphere. The heat treatment may be performed under a nitrogen atmosphere, reduced pressure, or the air (ultra-dry air).

In the case where the oxide semiconductor layer 403 is a crystalline oxide semiconductor film, the oxide semiconductor layer 403 may be partly amorphized by the introduction of the dopant 421. In that case, the crystallinity of the oxide semiconductor layer 403 can be recovered by performing a heat treatment thereon after the introduction of the dopant 421.

Thus, the oxide semiconductor layer 403 in which the low-resistance regions 404a and 404b are formed with the channel formation region 409 sandwiched between the low-resistance regions 404a and 404b.

Through the above-described process, the transistor 440a of this embodiment can be manufactured (see FIG. 1C). With the oxide semiconductor layer 403 which contains at least four kinds of elements of indium, gallium, zinc, and oxygen, and has a composition ratio (atomic percentage) of indium as twice or more as a composition ratio of gallium and a composition ratio of zinc, the transistor 440a can have excellent on-state characteristics (field-effect mobility), small off-state current, and high reliability.

Next, the insulating film 407 is formed over the oxide semiconductor layer 403, the source electrode layer 405a, the drain electrode layer 405b, the gate insulating film 402, and the gate electrode layer 401 (see FIG. 1D).

The insulating film 407 including the metal element can be formed by a plasma-enhanced CVD method, a sputtering method, an evaporation method, or the like. As the insulating film 407, an inorganic insulating film such as a silicon oxide film, a silicon oxynitride film, an aluminum oxide film, an aluminum oxynitride film, or a gallium oxide film can be typically used.

Alternatively, as the insulating film 407, an aluminum oxide film, a hafnium oxide film, a magnesium oxide film, a zirconium oxide film, a lanthanum oxide film, a barium oxide film, or a metal nitride film (e.g., an aluminum nitride film) can be used.

The insulating film 407 can be either a single film or a stacked film. The insulating film 407 can be a stack of a silicon oxide film and an aluminum oxide film, for example.

The insulating film 407 is preferably formed by a method such as a sputtering method, in which an impurity such as water or hydrogen does not enter the insulating film 407. In addition, it is preferable that the insulating film 407 include an excess of oxygen on the side closer to the oxide semiconductor layer 403 because the excess of oxygen serves as a supply source of oxygen for the oxide semiconductor layer 403.

In this embodiment, a silicon oxide film with a thickness of 100 nm is formed as the insulating film 407 by a sputtering method. The silicon oxide film can be formed by a sputtering method under a rare gas (typically, argon) atmosphere, an oxygen atmosphere, or a mixed atmosphere containing a rare gas and oxygen.

In order to remove residual moisture from the deposition chamber of the insulating film 407 in a manner similar to that of the deposition of the oxide semiconductor film, an entrapment vacuum pump (such as a cryopump) is preferably used. When the insulating film 407 is deposited in the deposition chamber evacuated using a cryopump, the impurity concentration of the insulating film 407 can be reduced. As an evacuation unit for removing moisture remaining in the deposition chamber of the insulating film 407, a turbo molecular pump provided with a cold trap may be used.

It is preferable that a high-purity gas in which an impurity such as hydrogen, water, a hydroxyl group, or hydride is reduced be used as the sputtering gas for the formation of the insulating film 407.

The aluminum oxide film which can be used as the insulating film 407 provided over the oxide semiconductor layer 403 has a high blocking effect by which both of oxygen and impurities such as hydrogen or moisture is prevented from being passed through the film.

Therefore, in and after the manufacturing process, the aluminum oxide film functions as a protective film for preventing entry of an impurity such as hydrogen or moisture, which causes a change, into the oxide semiconductor layer 403 and release of oxygen, which is a main constituent material of the oxide semiconductor, from the oxide semiconductor layer 403.

Further, a planarization insulating film may be formed thereover in order to reduce surface roughness due to the transistor. As the planarization insulating film, an organic material such as a polyimide-based resin, an acrylic-based resin, or a benzocyclobutene-based resin can be used. Other than such organic materials, it is also possible to use a low-dielectric constant material (a low-k material) or the like. Note that the planarization insulating film may be formed by stacking a plurality of insulating films formed from these materials.

Further, respective openings reaching the source electrode layer 405a and the drain electrode layer 405b are formed in the gate insulating film 402 and the insulating film 407, and a wiring layer 465a and a wiring layer 465b electrically connected to the source electrode layer 405a and the drain electrode layer 405b, respectively, are formed in the openings (see FIG. 1E). With the use of this wiring layers 465a and 465b, the transistor is connected to another transistor, which can lead to formation of a variety of circuits.

Figure 2C:
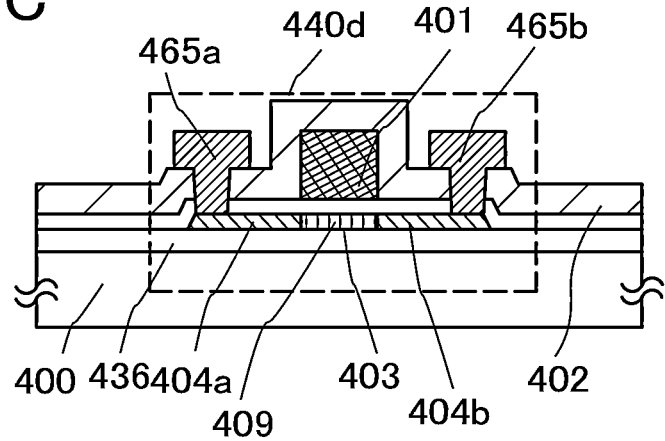

Alternatively, as a transistor 440d in FIG. 2C, the wirings 465a and 465b may be formed directly on the oxide semiconductor layer 403 without providing the source electrode layer 405a and the drain electrode layer 405b.

The wiring layers 465a and 465b can be formed with a material and a method which are similar to those of the gate electrode layer 401, the source electrode layer 405a, and the drain electrode layer 405b. For example, as the wiring layers 465a and 465b, a stack of a tantalum nitride film and a copper film or a stack of a tantalum nitride film and a tungsten film can be used.

In the oxide semiconductor layer 403 which is highly purified and whose oxygen vacancies are repaired, impurities such as hydrogen and water are sufficiently removed; the hydrogen concentration in the oxide semiconductor layer 403 is less than or equal to $5\times10^{19}$/cm$^3$, preferably less than or equal to $5\times10^{18}/cm^3$. The hydrogen concentration in the oxide semiconductor layer 403 is measured by secondary ion mass spectrometry (SIMS).

The current value in the off state (off-state current value) of the transistor 440a using the highly purified oxide semiconductor layer 403 containing an excess of oxygen that repairs an oxygen vacancy according to this embodiment is less than or equal to 100 zA per micrometer of channel width at room temperature (1 zA (zeptoampere)=$1\times10^{-21}$A), preferably less than or equal to 50 zA/mm.

In this manner, a structure of a transistor including an oxide semiconductor in a channel formation region in which the threshold voltage of electric characteristics of the transistor can be positive, which is a so-called normally-off switching element, and a manufacturing method thereof can be provided.

Further, in order to achieve a semiconductor device having higher performance, a structure for improving on-state characteristics of the transistor (e.g., on-state current and field-effect mobility) and for achieving high-speed response and high-speed operation of the semiconductor device and a manufacturing method thereof can be provided.

In addition, a highly reliable semiconductor device in which a threshold voltage does not easily shift even in a long-time use can be provided.

Embodiment 2

In this embodiment, another embodiment of a semiconductor device and a method for manufacturing the semiconductor device are described with reference to FIGS. 3A to 3C and FIGS. 4A to 4E. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

Figure 3A:
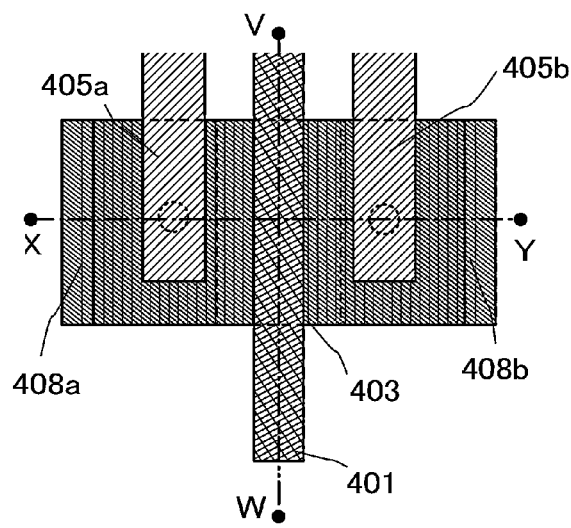
FIGS. 3A and 3C are diagrams showing one embodiment of a semiconductor device.
Figure 3C:
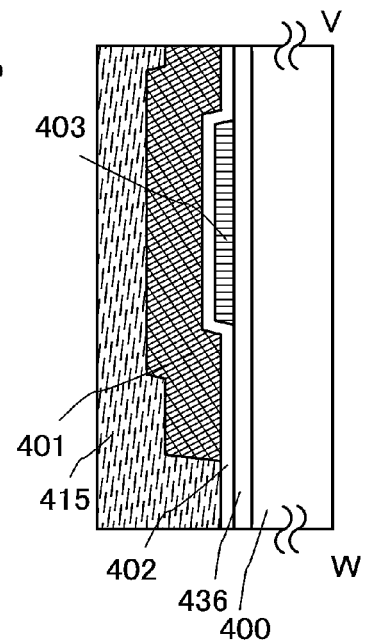
Figure 3B:
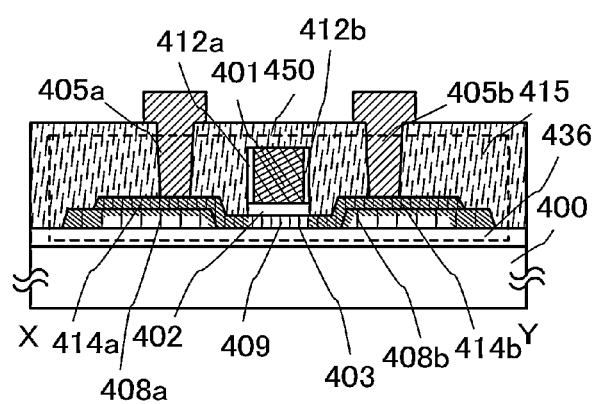

A transistor 450 illustrated in FIGS. 3A to 3C is an example of a top-gate transistor. FIG. 3A is a top view, FIG. 3B is a cross-sectional view taken along two-dot chain line X-Y in FIG. 3A, and FIG. 3C is a cross-sectional view taken along two-dot chain line V-W in FIG. 3A.

As shown in FIG. 3B which is a cross-sectional view in the channel length direction, the transistor 450 includes, over the substrate 400 having an insulating surface over which the oxide insulating layer 436 is formed, first oxide semiconductor layers 408a and 408b, a second oxide semiconductor layer 403 including the channel formation region 409 and low-resistance regions 414a and 414b, the source electrode layer 405a, the drain electrode layer 405b, the gate insulating film 402, and the gate electrode layer 401. The oxide semiconductor layers 408a and 408b are separated from each other on and in contact with the oxide insulating layer 436. The oxide semiconductor layer 403 is in contact with the oxide semiconductor layers 408a and 408b and the oxide insulating layer 436.

FIG. 3C is a cross-sectional view in the channel width direction. The oxide semiconductor layer 403 has a taper angle of 20° to 50°. When the oxide semiconductor layer 403 has a perpendicular end portion, oxygen is likely to be eliminated, and thus, oxygen defects easily occur. In contrast, when the oxide semiconductor layer 403 is tapered, the occurrence of oxygen defects is suppressed and thus the occurrence of leakage current (parasitic channel) in the transistor 450 is reduced.

The oxide semiconductor layers 408a and 408b are provided below the oxide semiconductor layer 403 with a thickness of 3 nm to 5 nm, so that contact resistance between the oxide semiconductor layer 403 and the source and drain electrode layers 405a and 405b can be reduced.

The low-resistance regions 414a and 414b can be formed by introducing a dopant into the oxide semiconductor layer 403 with the use of the gate electrode layer 401 as a mask. Further or alternatively, the low-resistance regions can be formed by diffusing a metal element. When the low-resistance regions are formed by introducing a dopant and diffusing a metal element, contact resistance with the wiring layers can be further reduced.

Further, a sidewall insulating layer may be formed on a side surface of the gate electrode layer 401. The transistor 450 includes thin sidewall insulating layers 412a and 412b on the side surfaces of the gate electrode layer 401. The sidewall insulating layers 412a and 412b may be formed on the side surface of the gate electrode layer 401 in a self-aligned manner by forming an insulating film to cover the gate electrode layer 401 and then processing the insulating film by anisotropic etching by a reactive ion etching (RIE) method. There is no particular limitation on the insulating film; for example, a silicon oxide film with favorable step coverage, which is formed by reacting tetraethyl orthosilicate (TEOS), silane, or the like with oxygen, nitrous oxide, or the like, can be used. The insulating film can be formed by a thermal CVD method, a plasma CVD method, an atmospheric pressure CVD method, a bias ECRCVD method, a sputtering method, or the like. A silicon oxide film formed by a low temperature oxidation (LTO) method may also be used.

With the sidewall insulating layers 412a and 412b, the gate electrode layer 401 and the low-resistance regions 414a and 414b can be prevented from being short-circuited.

When a dopant is introduced into the entire oxide semiconductor layers 408a and 408b to form the low-resistance regions, the transistor can be electrically connected with another conductive layer, below the oxide semiconductor layers 408a and 408b, i.e., from the oxide insulating layer 436 side.

When the oxide semiconductor layer 403 is formed using an IGZO film which contains at least four kinds of elements of indium, gallium, zinc, and oxygen, and has a composition ratio (atomic percentage) of indium as twice or more as a composition ratio of gallium and a composition ratio of zinc has high field-effect mobility, the thickness of the oxide semiconductor layer 403 is decreased to 3 nm to 5 nm, whereby a transistor can be prevented from being normally-on caused by a short-channel effect.

For the oxide semiconductor layers 408a and 408b, an indium oxide, a tin oxide, a zinc oxide; a two-component metal oxide such as an In—Zn—based oxide, a Sn—Zn—based oxide, an Al—Zn—based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

As the oxide semiconductor layers 408a and 408b, an oxide semiconductor layer having a high conductivity can be used.

In this embodiment, an oxide semiconductor layer formed using an oxide target having a composition ratio of indium:gallium:zinc=1:1:1 is used as each of the oxide semiconductor layers 408a and 408b.

The thickness of each of the oxide semiconductor layers 408a and 408b is preferably 20 nm to 50 nm.

An example of a method for manufacturing the transistor 450 is described with reference to FIGS. 4A to 4E.

Figure 4A:
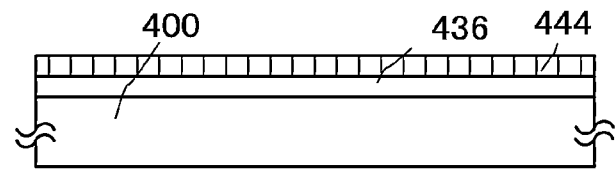
FIGS. 4A to 4E are diagrams showing one embodiment of a semiconductor device and a method for manufacturing the semiconductor device.
Figure 4B:
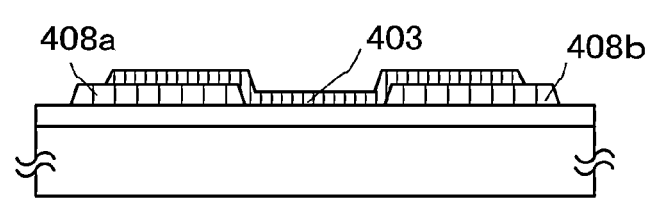

First, the oxide insulating layer 436 is formed over the substrate 400 having an insulating surface and the oxide semiconductor film 444 is formed over the oxide insulating layer 436 (see FIG. 4A). In this embodiment, the oxide semiconductor film 444 is formed using an oxide target having a composition ratio of indium:gallium:zinc=1:1:1, by a sputtering method.

Then, the oxide semiconductor film 444 is processed into an island shape by a photolithography process to form the pair of oxide semiconductor layers 408a and 408b which are separated from each other. The oxide semiconductor layer 403 is formed in contact with the oxide semiconductor layers 408a and 408b and the oxide insulating layer 436 (see FIG. 4B). The oxide semiconductor layer 403 is formed using an oxide target having a composition ratio of indium:gallium:zinc=3:1:2 by a sputtering method. The oxide semiconductor layer 403 is preferably tapered, and in this embodiment, has a taper angle of 30°.

Figure 4C:
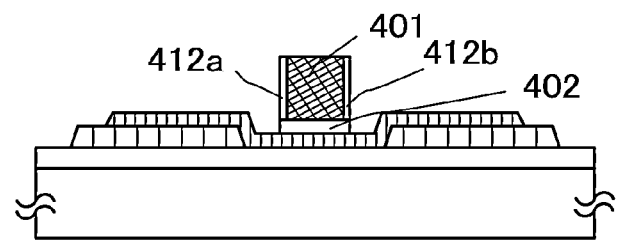

Next, over the oxide semiconductor layer 403, the gate insulating film 402, the gate electrode layer 401, the sidewall insulating layers 412a and 412b which cover side surfaces of the gate electrode layer 401 are formed (see FIG. 4C). The gate insulating film 402 can be formed by forming an insulating film over the oxide semiconductor layer 403 and etching the insulating film with the use of the gate electrode layer 401 and the sidewall insulating layers 412a and 412b as masks. Note that part of the oxide semiconductor layer 403 is exposed.

Next, a film 417 including a metal element is formed over the oxide semiconductor layer 403, the gate insulating film 402, and the gate electrode layer 401 to be in contact with the part of the oxide semiconductor layer 403.

As the film 417 including the metal element, a metal film, a metal oxide film, a metal nitride film, and the like are used.

As the metal element included in the film including the metal element, one or more selected from aluminum (Al), titanium (Ti), molybdenum (Mo), tungsten (W), hafnium (Hf), tantalum (Ta), lanthanum (La), barium (Ba), magnesium (Mg), zirconium (Zr), and nickel (Ni) can be used. As the film including the metal element, a metal film, a metal oxide film, or a metal nitride film including at least one of the above-described metal elements (such a metal nitride film is, for example, a titanium nitride film, a molybdenum nitride film, or a tungsten nitride film) can be used. Further, a dopant such as phosphorus (P) or boron (B) may be included in the film including the metal element. In this embodiment, the film 417 including the metal element has electrical conductivity.

The film 417 including the metal element can be formed by a plasma-enhanced CVD method, a sputtering method, an evaporation method, or the like. The thickness of the film 417 including the metal element may be greater than or equal to 5 nm and less than or equal to 30 nm.

In this embodiment, a 10-nm-thick aluminum film is formed by a sputtering method as the film 417 including the metal element.

Figure 4D:
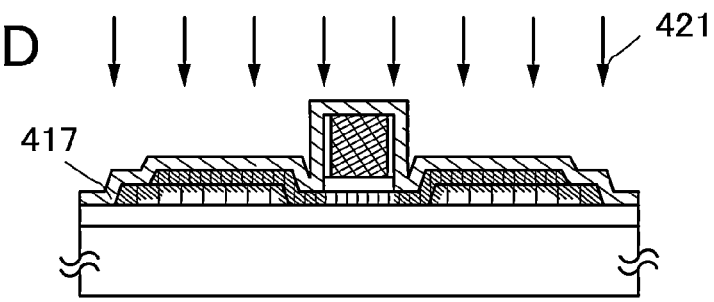
Figure 4E:
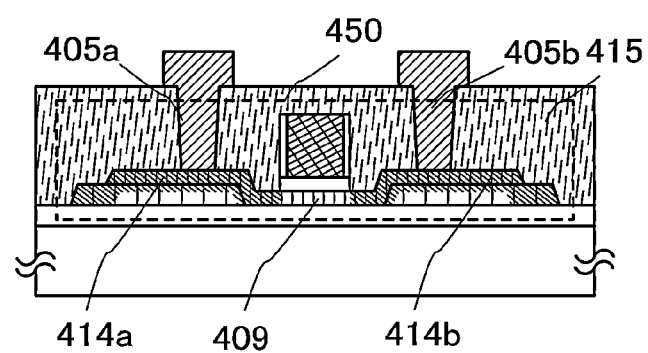

Next, the dopant 421 is selectively introduced into the oxide semiconductor layer 403 through the film 417 including the metal element with the gate insulating film 402, the gate electrode layer 401, and the sidewall insulating layers 412a and 412b as a mask, so that low-resistance regions are formed (see FIG. 4D).

The dopant 421 is an impurity by which the electrical conductivity of the oxide semiconductor layer 403 is changed. One or more selected from the following can be used as the dopant 421: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

The dopant may be included in the film 417 including the metal element.

The dopant 421 is introduced into the oxide semiconductor layer 403 through the film 417 including the metal element by an implantation method. As the method for introducing the dopant 421, an ion implantation method, an ion doping method, a plasma immersion ion implantation method, or the like can be used. In the case where the above method is used, it is preferable to use a single ion of the dopant 421 or a hydride ion, a fluoride ion, or a chloride ion.

The introduction of the dopant 421 may be controlled by setting the addition conditions such as the accelerated voltage and the dosage, or the thickness of the film 417 including the metal element as appropriate. The dose can be greater than or equal to $1 \times 10^{13}$ ions/cm$^2$ and less than or equal to $5 \times 10^{16}$ ions/cm$^2$. For example, for introduction of an boron ion by an ion implantation method using boron, the accelerated voltage and the dosage may be set to 15 kV and $1 \times 10^{15}$ ions/cm$^2$, respectively.

The concentration of the dopant 421 in the low-resistance region is preferably greater than or equal to $5 \times 10^{18}$/cm$^3$ and less than or equal to $1 \times 10^{22}$/cm$^3$.

The substrate 400 may be heated in introducing the dopant.

The introduction of the dopant 421 into the oxide semiconductor layer 403 may be performed more than once, and the number of kinds of dopant may be plural.

Further, heat treatment may be performed thereon after the introduction of the dopant 421. The heat treatment is preferably performed at a temperature(s) higher than or equal to 300° C. and lower than or equal to 700° C. (further preferably higher than or equal to 300° C. and lower than or equal to 450° C.) for one hour in an oxygen atmosphere. The heat treatment may be performed in a nitrogen atmosphere, reduced pressure, or the air (ultra-dry air).

Next, heat treatment is performed in the state where the film 417 including the metal element and the oxide semiconductor layer 403 are partly in contact with each other. The heat treatment is preferably performed in an oxygen atmosphere. The heat treatment can also be performed under reduced pressure or a nitrogen atmosphere. The heating temperature may be set to be higher than or equal to 100° C. and lower than or equal to 700° C., preferably higher than or equal to 200° C. and lower than or equal to 400° C.

For example, the substrate is put in an electric furnace which is one of heat treatment apparatuses, and heat treatment is performed on the film 417 including the metal element and the oxide semiconductor layer 403 at 200° C. for one hour in an oxygen atmosphere.

Further, a heat treatment apparatus used is not limited to an electric furnace, and a device for heating a process object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

The heat treatment may be performed in an atmosphere of nitrogen, oxygen, ultra-dry air (air in which a water content is 20 ppm or lower, preferably 1 ppm or lower, more preferably 10 ppb or lower), or a rare gas (argon, helium, or the like). Note that it is preferable that water, hydrogen, or the like be not contained in the atmosphere of nitrogen, oxygen, ultra-dry air, or a rare gas. It is also preferable that the purity of nitrogen, oxygen, or the rare gas which is introduced into a heat treatment apparatus be set to be 6N (99.9999%) or higher, preferably 7N (99.99999%) or higher (that is, the impurity concentration is 1 ppm or lower, preferably 0.1 ppm or lower).

By the heat treatment, the metal element is introduced into the oxide semiconductor layer 403 from the film 417 including the metal element, so that low-resistance regions 414a and 414b are formed. In this manner, in the oxide semiconductor layer 403, the low-resistance regions 414a and 414b including the dopant and the metal element are formed between which a channel formation region 409 is provided.

In this embodiment, boron is used as the dopant and aluminum is used as the metal element, and therefore the low-resistance regions 414a and 414b contain boron and aluminum.

Then, the film 417 including the metal element is removed by etching. The film 417 including the metal element is removed by wet etching, in this embodiment.

Through the above process, the transistor 450 of this embodiment can be manufactured. With the oxide semiconductor layer 403 including the low-resistance regions 414a and 414b with the channel formation region 409 provided therebetween in the channel length direction, on-state characteristics (e.g., on-state current and field-effect mobility) of the transistor 450 are increased, which enables high-speed operation and high-speed response of the transistor 450.

The low-resistance regions 414a and 414b each can be functioned as a source region or a drain region. With the low-resistance regions 414a and 414b, the electrical field applied to the channel formation region 409 formed between the low-resistance regions 414a and 414b can be relaxed. Further, electrical connection between the oxide semiconductor layer 403 and each of the source electrode layer 405a and the drain electrode layer 405b in the low-resistance regions 414a and 414b, respectively, can reduce the contact resistance between the oxide semiconductor layer 403 and each of the source electrode layer 405a and the drain electrode layer 405b.

Further, a planarization insulating film may be formed thereover in order to reduce surface roughness due to the transistor. As the planarization insulating film, an organic material such as a polyimide-based resin, an acrylic-based resin, or a benzocyclobutene-based resin can be used. Other than such organic materials, it is also possible to use a low-dielectric constant material (a low-k material) or the like. Note that the planarization insulating film may be formed by stacking a plurality of insulating films formed from these materials.

In this embodiment, a planarization insulating film 415 is formed over the transistor 450. Further, openings reaching the oxide semiconductor layer 403 are formed in the planarization insulating film 415, and the source electrode layer 405a and the drain electrode layer 405b are formed so as to be electrically connected to the oxide semiconductor layer 403 through the openings (see FIG. 4E).

In this manner, a structure of a transistor including an oxide semiconductor in a channel formation region in which the threshold voltage of electric characteristics of the transistor can be positive, which is a so-called normally-off switching element, and a manufacturing method thereof can be provided.

Further, in order to achieve a semiconductor device having higher performance, a structure for improving on-state characteristics of the transistor (e.g., on-state current and field-effect mobility) and for achieving high-speed response and high-speed operation of the semiconductor device and a manufacturing method thereof can be provided.

In addition, a semiconductor device in which reliability is high and threshold voltage does not easily shift even in a long-time use can be provided.

This embodiment can be implemented combining with the other embodiments as appropriate.

Embodiment 3

In this embodiment, an example of a semiconductor device which includes the transistor described in Embodiment 1 or 2, which can hold stored data even when not powered, and which does not have a limitation on the number of write cycles, will be described with reference to drawings. Note that a transistor 162 included in the semiconductor device in this embodiment is the transistor described in Embodiment 1 or 2. Any of the transistors described in Embodiment 1 or 2 can be used as the transistor 162.

Since the off-state current of the transistor 162 is small, stored data can be held for a long time owing to such a transistor. In other words, power consumption can be sufficiently reduced because a semiconductor storage device in which refresh operation is unnecessary or the frequency of refresh operation is extremely low can be provided.

Figure 5A:
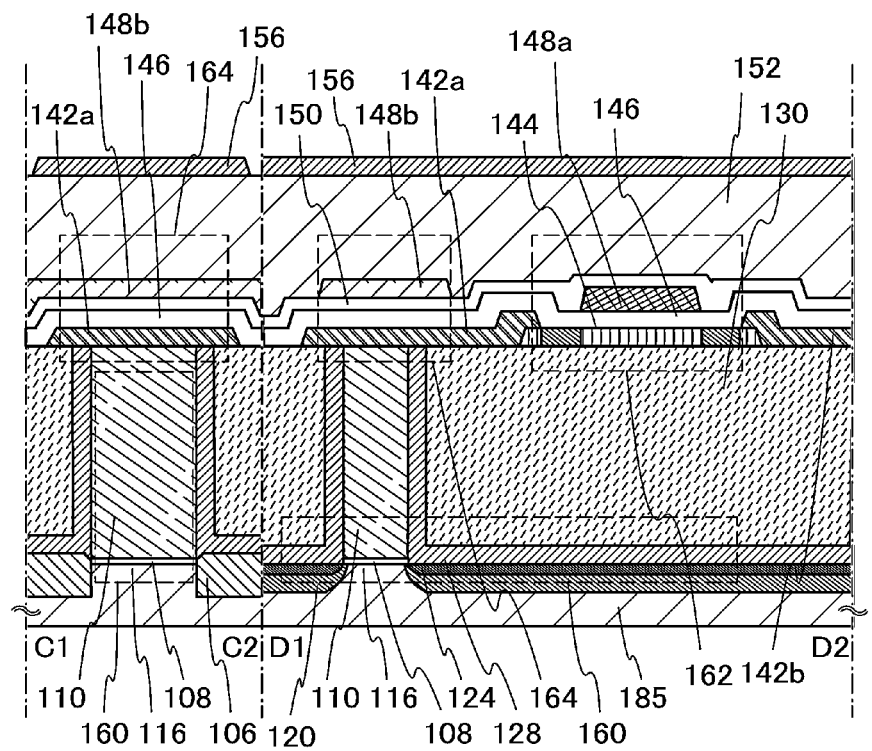
FIGS. 5A to 5C are a cross-sectional view, a plan view, and a circuit diagram showing one embodiment of a semiconductor device.
Figure 5B:
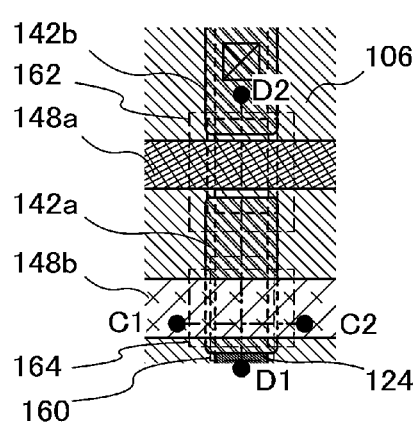
Figure 5C:
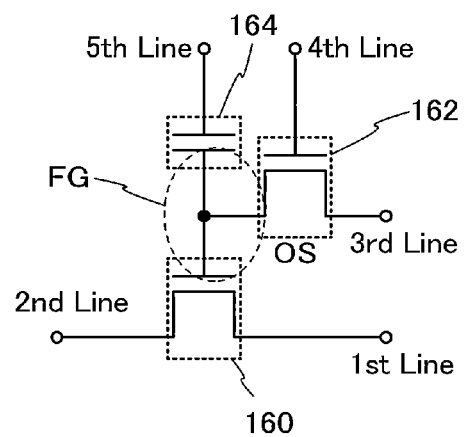

FIGS. 5A and 5B illustrate an example of a structure of a semiconductor device. FIG. 5A is a cross-sectional view of the semiconductor device, FIG. 5B is a plan view of the semiconductor device, and FIG. 5C is a circuit diagram of the semiconductor device. Here, FIG. 5A corresponds to a cross section along line C1-C2 and line D1-D2 in FIG. 5B.

The semiconductor device illustrated in FIGS. 5A and 5B includes a transistor 160 including a first semiconductor material in a lower portion, and a transistor 162 including a second semiconductor material in an upper portion. The transistor 162 can have the same structure as that described in Embodiment 1 or 2.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material other than an oxide semiconductor can operate at high speed easily. On the other hand, a transistor including an oxide semiconductor can hold charge for a long time owing to its characteristics.

Although all the transistors are n-channel transistors here, p-channel transistors can be used. The technical nature of the disclosed invention is to use an oxide semiconductor in the transistor 162 so that data can be held. Therefore, it is not necessary to limit a specific structure of the semiconductor device, such as a material of the semiconductor device or a structure of the semiconductor device, to the structure described here.

The transistor 160 in FIG. 5A includes a channel formation region 116 provided over a substrate 185 including a semiconductor material (e.g., silicon), impurity regions 120 with the channel formation region 116 provided therebetween, metal compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

An element isolation insulating layer 106 is provided over the substrate 185 to surround the transistor 160. An insulating layer 130 is provided to cover the transistor 160. Note that in order to realize high integration, it is preferable that, as in FIG. 5A, the transistor 160 does not have a sidewall insulating layer. On the other hand, when the characteristics of the transistor 160 have priority, the sidewall insulating layer may be formed on a side surface of the gate electrode 110 and the impurity regions 120 may include a region having a different impurity concentration.

The transistor 162 shown in FIG. 5A includes an oxide semiconductor in the channel formation region. Here, an oxide semiconductor layer 144 included in the transistor 162 is preferably highly purified. By using a highly purified oxide semiconductor, the transistor 162 can have extremely favorable off-state current characteristics.

An insulating layer 150 having a single-layer structure or a stacked-layer structure is provided over the transistor 162. In addition, a conductive layer 148b is provided in a region overlapping with the electrode layer 142a of the transistor 162 with the insulating layer 150 provided therebetween, and the electrode layer 142a, the insulating layer 150, and the conductive layer 148b form a capacitor 164. That is, the electrode layer 142a of the transistor 162 functions as one electrode of the capacitor 164, and the conductive layer 148b functions as the other electrode of the capacitor 164. Note that the capacitor 164 may be omitted if a capacitor is not needed. Alternatively, the capacitor 164 may be separately provided above the transistor 162.

The insulating layer 152 is provided over the transistor 162 and the capacitor 164. Further, a wiring 156 for connecting the transistor 162 to another transistor is provided over the insulating layer 152. Although not illustrated in FIG. 5A, the wiring 156 is electrically connected to the electrode layer 142b through an electrode formed in an opening provided in the insulating layer 150, the insulating layer 152, the gate insulting film 146, and the like. Here, the electrode is preferably provided so as to partly overlap with at least the oxide semiconductor layer 144 of the transistor 162.

In FIGS. 5A and 5B, the transistor 160 is provided so as to overlap with at least part of the transistor 162. The source region or the drain region of the transistor 160 is preferably provided so as to overlap with part of the oxide semiconductor layer 144. Further, the transistor 162 and the capacitor 164 are provided so as to overlap with at least part of the transistor 160. For example, the conductive layer 148b of the capacitor 164 is provided so as to overlap with at least part of the gate electrode 128 of the transistor 160. With such a planar layout, the area occupied by the semiconductor device can be reduced; thus, higher integration can be achieved.

Note that the electrical connection between the electrode layer 142b and the wiring 156 may be established by direct contact of the electrode layer 142b and the wiring 156 with each other or through an electrode provided in an insulating layer lying therebetween. Alternatively, the electrical connection may be established through a plurality of electrodes.

Next, an example of a circuit configuration corresponding to FIGS. 5A and 5B is illustrated in FIG. 5C.

In FIG. 5C, a first wiring (1st Line) is electrically connected to a source electrode of the transistor 160. A second wiring (2nd Line) is electrically connected to a drain electrode of the transistor 160. A third wiring (a 3rd line) and one of source or drain electrodes of the transistor 162 are electrically connected to each other, and a fourth wiring (a 4th line) and a gate electrode of the transistor 162 are electrically connected to each other. A gate electrode of the transistor 160 and one of the source electrode and the drain electrode of the transistor 162 are electrically connected to one electrode of the capacitor 164. A fifth line (a 5th Line, also referred to as a word line) and the other electrode of the capacitor 164 are electrically connected to each other.

The semiconductor device in FIG. 5C utilizes a characteristic in which the potential of the gate electrode of the transistor 160 can be held, and thus enables data writing, holding, and reading as follows.

Writing and holding of data are described. First, the potential of the fourth line is set to a potential at which the transistor 162 is turned on, so that the transistor 162 is turned on. Accordingly, the potential of the third line is supplied to the gate electrode of the transistor 160 and the capacitor 164. That is, predetermined charge is given to the gate electrode of the transistor 160 (writing). Here, charge for supply of a potential level or charge for supply of a different potential level (hereinafter referred to as Low level charge and High level charge) is given. After that, the potential of the fourth line is set to a potential at which the transistor 162 is turned off, so that the transistor 162 is turned off. Thus, the charge given to the gate electrode of the transistor 160 is held (storing).

Since the off-state current of the transistor 162 is extremely low, the charge of the gate electrode of the transistor 160 is held for a long time.

Next, reading of data is described. By supplying an appropriate potential (reading potential) to the fifth line while a predetermined potential (constant potential) is supplied to the first line, the potential of the second line varies depending on the amount of charge held in the gate electrode of the transistor 160. This is because in general, when the transistor 160 is an n-channel transistor, an apparent threshold voltage $V_{th\_H}$ in the case where a high-level charge is given to the gate electrode of the transistor 160 is lower than an apparent threshold voltage $V_{th\_L}$ in the case where a low-level charge is given to the gate electrode of the transistor 160. Here, an apparent threshold voltage refers to the potential of the fifth line, which is needed to turn on the transistor 160. Thus, the potential of the fifth wiring is set to a potential $V_0$ which is between $V_{th\_H}$ and $V_{th\_L}$, whereby charge given to the gate electrode of the transistor 160 can be determined. For example, in the case where a high-level charge is given in writing, when the potential of the fifth wiring is set to $V_0$ ($>V_{th\_H}$), the transistor 160 is turned on. In the case where a low level charge is given in writing, even when the potential of the fifth wiring is set to $V_0$ ($<V_{th\_L}$), the transistor 160 remains in an off state. Therefore, the stored data can be read by the potential of the second line.

Note that in the case where memory cells are arrayed to be used, only data of desired memory cells needs to be read. In the case where such reading is not performed, a potential at which the transistor 160 is turned off, that is, a potential smaller than $V_{th\_H}$ may be given to the fifth wiring regardless of the state of the gate electrode of the transistor 160. Alternatively, a potential which allows the transistor 160 to be turned on regardless of a state of the gate electrode, that is, a potential higher than $V_{th\_L}$ may be applied to the fifth lines.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

Since the transistor 162 includes an oxide semiconductor layer which contains at least four kinds of elements of indium, gallium, zinc, and oxygen, and has a composition ratio (atomic percentage) of indium as twice or more as a composition ratio of gallium and a composition ratio of zinc, the transistor 162 can have a positive threshold voltage. With the transistor employed, a high-quality semiconductor device can be provided. Further, the semiconductor device in this embodiment includes a transistor in which the threshold voltage does not easily shift even in a long-period of use; thus, the semiconductor device can have high reliability.

The methods and structures described in this embodiment can be combined as appropriate with any of the methods and structures described in the other embodiments.

Embodiment 4

In this embodiment, a semiconductor device which includes the transistor described in Embodiment 1 or 2, which can hold stored data even when not powered, and which does not have a limitation on the number of write cycles, and which has a structure different from the structure described in Embodiment 3 is described with reference to FIGS. 6A and 6B and FIGS. 7A to 7C. Note that the transistor 162 included in the semiconductor device in this embodiment is the transistor described in Embodiment 1 or 2. Any of the transistors described in Embodiment 1 or 2 can be used as the transistor 162.

Figure 6A:
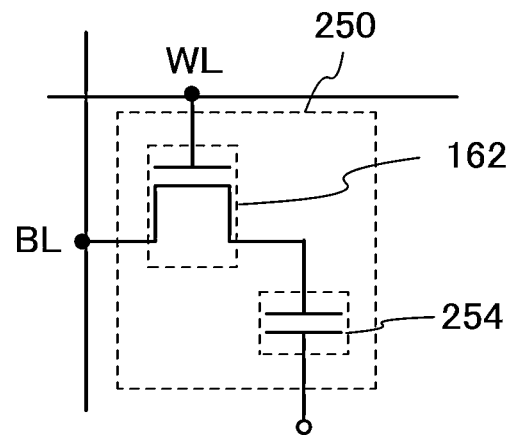
FIGS. 6A and 6B are a circuit diagram and a perspective view showing one embodiment of a semiconductor device.
Figure 6B:
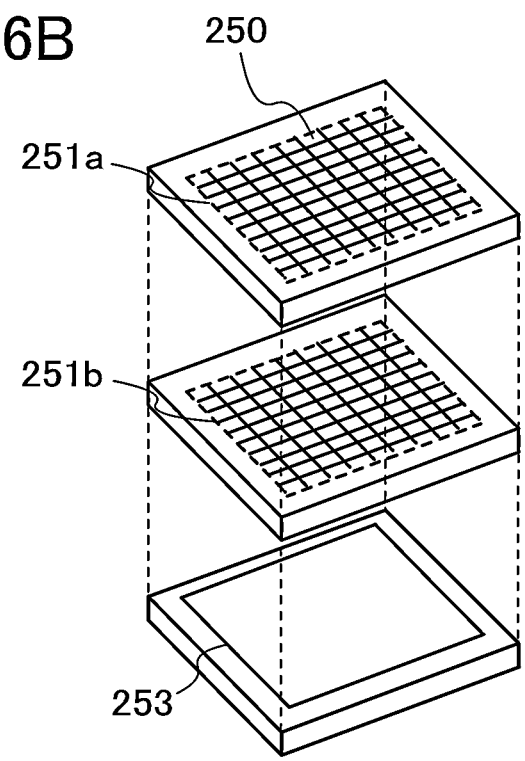

FIG. 6A illustrates an example of a circuit configuration of a semiconductor device, and FIG. 6B is a conceptual diagram illustrating an example of a semiconductor device. First, the semiconductor device illustrated in FIG. 6A is described, and then, the semiconductor device illustrated in FIG. 6B is described.

In the semiconductor device illustrated in FIG. 6A, a bit line BL is electrically connected to the source electrode or the drain electrode of the transistor 162, a word line WL is electrically connected to the gate electrode of the transistor 162, and the source electrode or the drain electrode of the transistor 162 is electrically connected to a first terminal of a capacitor 254.

The transistor 162 including an oxide semiconductor has extremely low off-state current. For that reason, a potential of the first terminal of the capacitor 254 (or a charge accumulated in the capacitor 254) can be held for an extremely long period by turning off the transistor 162.

Next, writing and holding of data in the semiconductor device (a memory cell 250) illustrated in FIG. 6A are described.

First, the potential of the word line WL is set to a potential at which the transistor 162 is turned on, so that the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the charge at the first terminal of the capacitor 254 is held (holding).

Because the off-state current of the transistor 162 is extremely small, the potential of the first terminal of the capacitor 254 (or the charge accumulated in the capacitor) can be held for a long time.

Secondly, reading of data is described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B*V_{B0}+C*V)/(C_B+C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1>V_0$), the potential of the bit line BL in the case of holding the potential $V_1$ ($=(C_B*V_{B0}+C*V_1)/(C_B+C)$) is higher than the potential of the bit line BL in the case of holding the potential $V_0$ ($=(C_B*V_{B0}+C*V_0)/(C_B+C)$).

Then, by comparing the potential of the bit line BL with a predetermined potential, data can be read.

As described above, the semiconductor device illustrated in FIG. 6A can hold charge that is accumulated in the capacitor 254 for a long time because the off-state current of the transistor 162 is extremely low. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 6B is described.

The semiconductor device illustrated in FIG. 6B includes a memory cell array 251 (memory cell arrays 251a and 251b) including a plurality of memory cells 250 illustrated in FIG. 6A as memory circuits in the upper portion, and a peripheral circuit 253 in the lower portion which is necessary for operating the memory cell array 251 (the memory cell arrays 251a and 251b). Note that the peripheral circuit 253 is electrically connected to the memory cell array 251.

In the structure illustrated in FIG. 6B, the peripheral circuit 253 can be provided under the memory cell array 251 (the memory cell arrays 251a and 251b). Thus, the size of the semiconductor device can be decreased.

It is preferable that a semiconductor material of the transistor provided in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 6B illustrates, as an example, the semiconductor device in which two memory cell arrays (the memory cell array 251a and the memory cell array 251b) are stacked; however, the number of memory cell arrays to be stacked is not limited thereto. Three or more memory cell arrays may be stacked.

Next, a specific structure of the memory cell 250 illustrated in FIG. 6A is described with reference to FIGS. 7A to 7C.

Figure 7A:
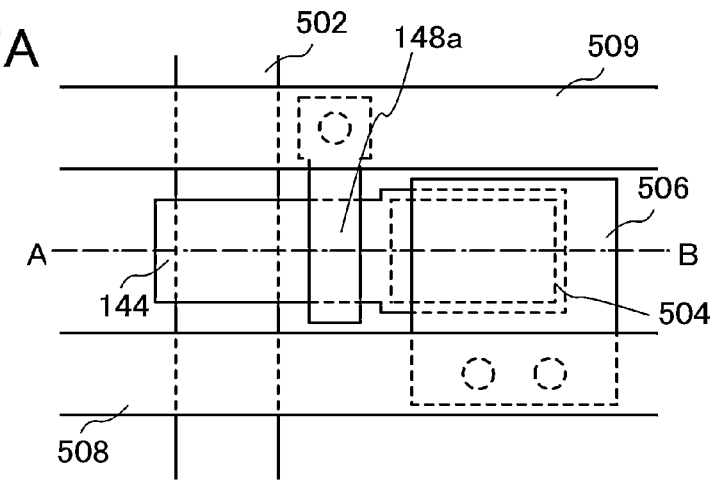
FIGS. 7A to 7C are a plan view and cross-sectional views showing one embodiment of a semiconductor device.
Figure 7B:
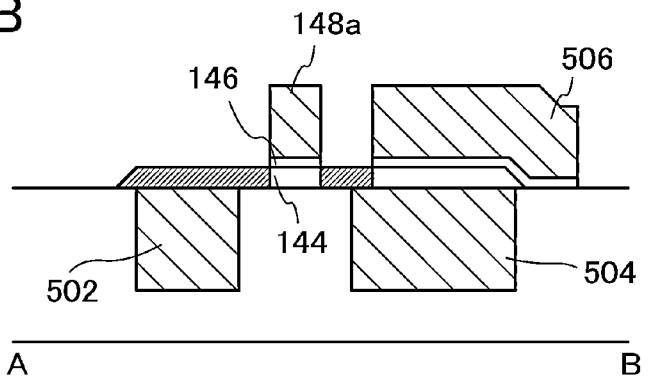
Figure 7C:
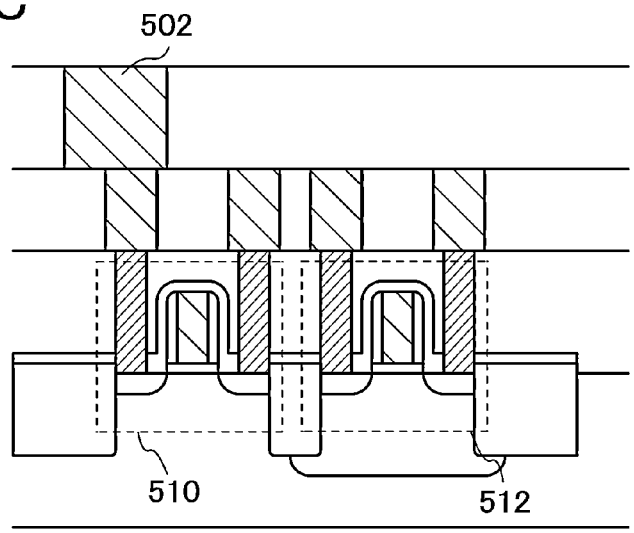

FIGS. 7A to 7C illustrate a structure example of the memory cell 250. FIG. 7A is a plan view of the memory cell 250. FIG. 7B is a cross-sectional view taken along line A-B in FIG. 7A.

The transistor 162 in FIGS. 7A and 7B can have the same structure as the transistor in Embodiment 1 or 2.

As illustrated in FIG. 7B, the transistor 162 is formed over an electrode 502 and an electrode 504. The electrode 502 serves as a bit line BL in FIG. 6A and is in contact with the low-resistance region of the transistor 162. The electrode 504 serves as one electrode of the capacitor 254 in FIG. 6A and is in contact with the low-resistance region of the transistor 162. Over the transistor 162, the electrode 506 provided in a region overlapping with the electrode 504 serves as the other electrode of the capacitor 254.

As illustrated in FIG. 7A, the other electrode 506 of the capacitor 254 is electrically connected to a capacitor line 508. A gate electrode 148a over the oxide semiconductor layer 144 with the gate insulating film 146 provided therebetween is electrically connected to a word line 509.

FIG. 7C is a cross-sectional view in a connection portion between the memory cell array 251 and the peripheral circuit. The peripheral circuit can include, for example, an n-channel transistor 510 and a p-channel transistor 512. The n-channel transistor 510 and the p-channel transistor 512 are preferably formed using a semiconductor material other than an oxide semiconductor (e.g., silicon). With such a material, the transistor included in the peripheral circuit can operate at high speed.

When the planar layout in FIG. 7A is employed, the area occupied by the semiconductor device can be reduced; thus, the degree of integration can be increased.

As described above, the plurality of memory cells formed in multiple layers in the upper portion each include a transistor including an oxide semiconductor. Since the off-state current of the transistor including an oxide semiconductor which contains at least four kinds of elements of indium, gallium, zinc, and oxygen, and has a composition ratio (atomic percentage) of indium as twice or more as a composition ratio of gallium and a composition ratio of zinc, is low, stored data can be held for a long time owing to the transistor. In other words, the frequency of refresh operation can be significantly lowered, which leads to a sufficient reduction in power consumption. Further, as illustrated in FIG. 7B, the capacitor 254 is formed by stacking the electrode 504, the oxide semiconductor layer 144, the gate insulating film 146, and the electrode 506. Since the relative permittivity of the oxide semiconductor layer with the above-described composition is extremely high (a relative permittivity of 66), the area required for the capacitor 254 can be reduced when the oxide semiconductor layer is used as a dielectric film.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

This embodiment can be implemented in appropriate combination with the structures described in the other embodiments.

Embodiment 5

In this embodiment, examples of application of the semiconductor device described in any of the above embodiments to portable devices such as cellular phones, smartphones, or electronic books will be described with reference to FIGS. 8A and 8B, FIG. 9, FIG. 10, and FIG. 11.

In portable electronic devices such as a mobile phone, a smart phone, and an e-book reader, an SRAM or a DRAM is used so as to store image data temporarily. This is because response speed of a flash memory is low and thus a flash memory is not suitable for image processing. On the other hand, an SRAM or a DRAM has the following characteristics when used for temporary storage of image data.

Figure 8A:
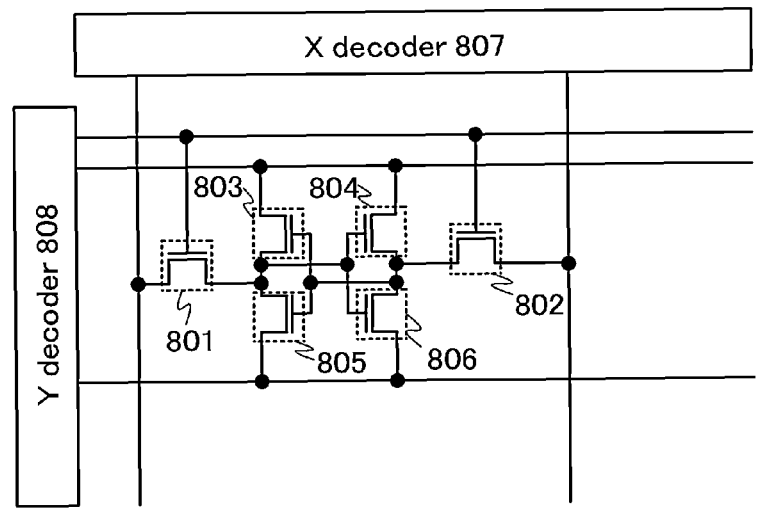
FIGS. 8A and 8B are circuit diagrams showing one embodiment of a semiconductor device.

In an ordinary SRAM, as illustrated in FIG. 8A, one memory cell includes six transistors, that is, transistors 801 to 806, which are driven with an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 8B:
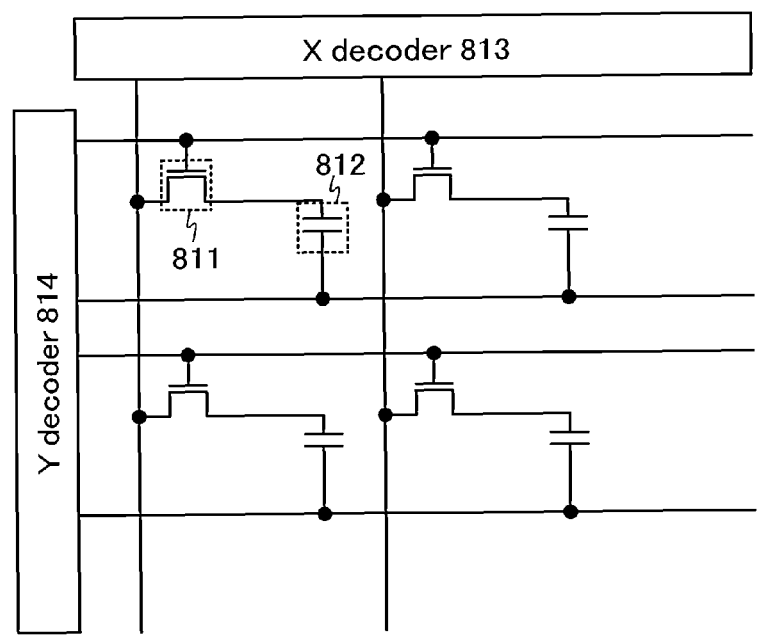

In a DRAM, as illustrated in FIG. 8B, a memory cell includes a transistor 811 and a storage capacitor 812, which are driven with an X decoder 813 and a Y decoder 814. One cell includes one transistor and one capacitor and thus the area of a memory cell is small. The area of a memory cell of a DRAM is generally less than or equal to 10 $F^2$. Note that in the case of a DRAM, a refresh operation is always necessary and power is consumed even when a rewriting operation is not performed.

However, the area of the memory cell of the semiconductor device described the above embodiments is about 10 $F^2$ and frequent refreshing is not needed. Therefore, the area of the memory cell is reduced, and the power consumption can be reduced.

Figure 9:
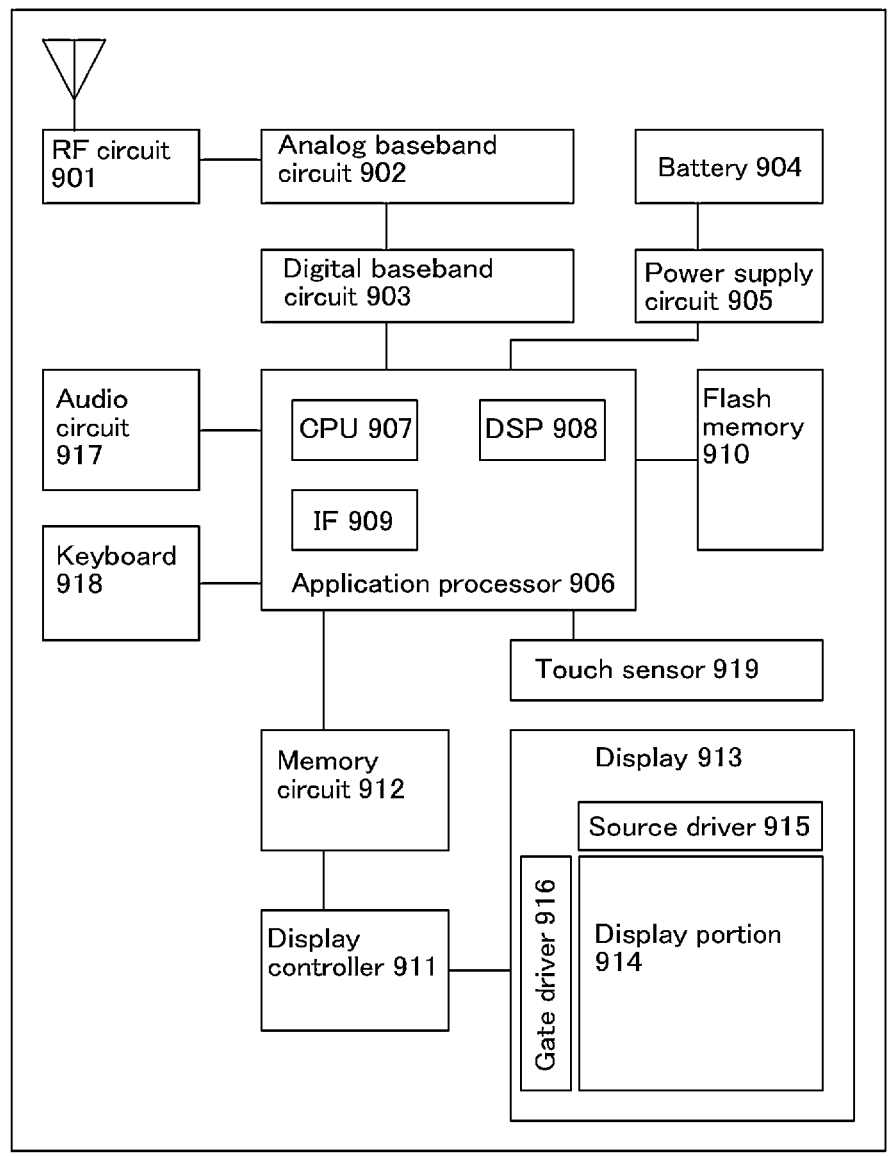
FIG. 9 is a block diagram showing one embodiment of a semiconductor device.

Next, FIG. 9 is a block diagram of a portable device. The portable device illustrated in FIG. 9 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 10:
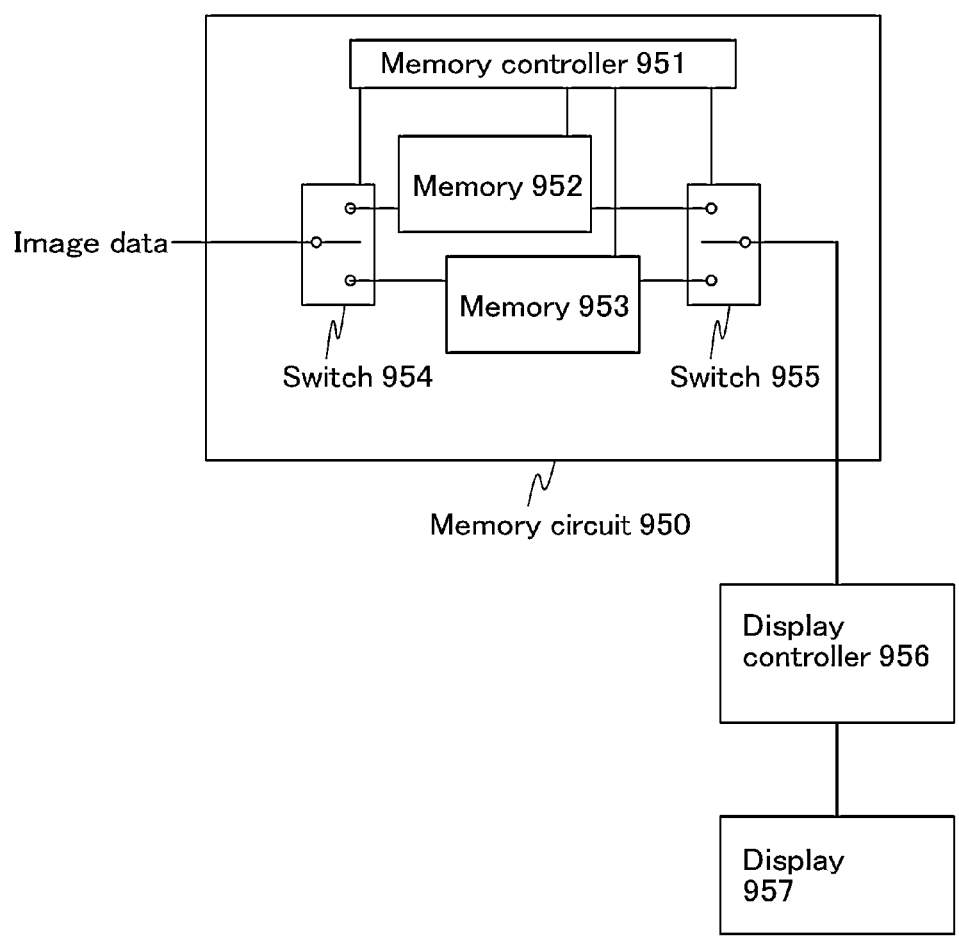
FIG. 10 is a block diagram showing one embodiment of a semiconductor device.

FIG. 10 illustrates an example of using the semiconductor device described in any of the above embodiments in a memory circuit 950 for a display. The memory circuit 950 illustrated in FIG. 10 includes a memory 952, a memory 953, a switch 954, a switch 955, and a memory controller 951. Further, in the memory circuit 950, a signal line (input image data), a display controller 956 which reads and controls data held in the memories 952 and 953, and a display 957 which displays data by a signal from the display controller 956 are connected.

First, image data (input image data A) is formed by an application processor (not shown). The input image data A is held in the memory 952 though the switch 954. The image data (stored image data A) held in the memory 952 is transmitted and displayed to the display 957 through the switch 955 and the display controller 956.

In the case where the input image data A is not changed, the stored image data A is read from the display controller 956 through the memory 952 and the switch 955 with a frequency of 30 Hz to 60 Hz in general.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is held in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 11:
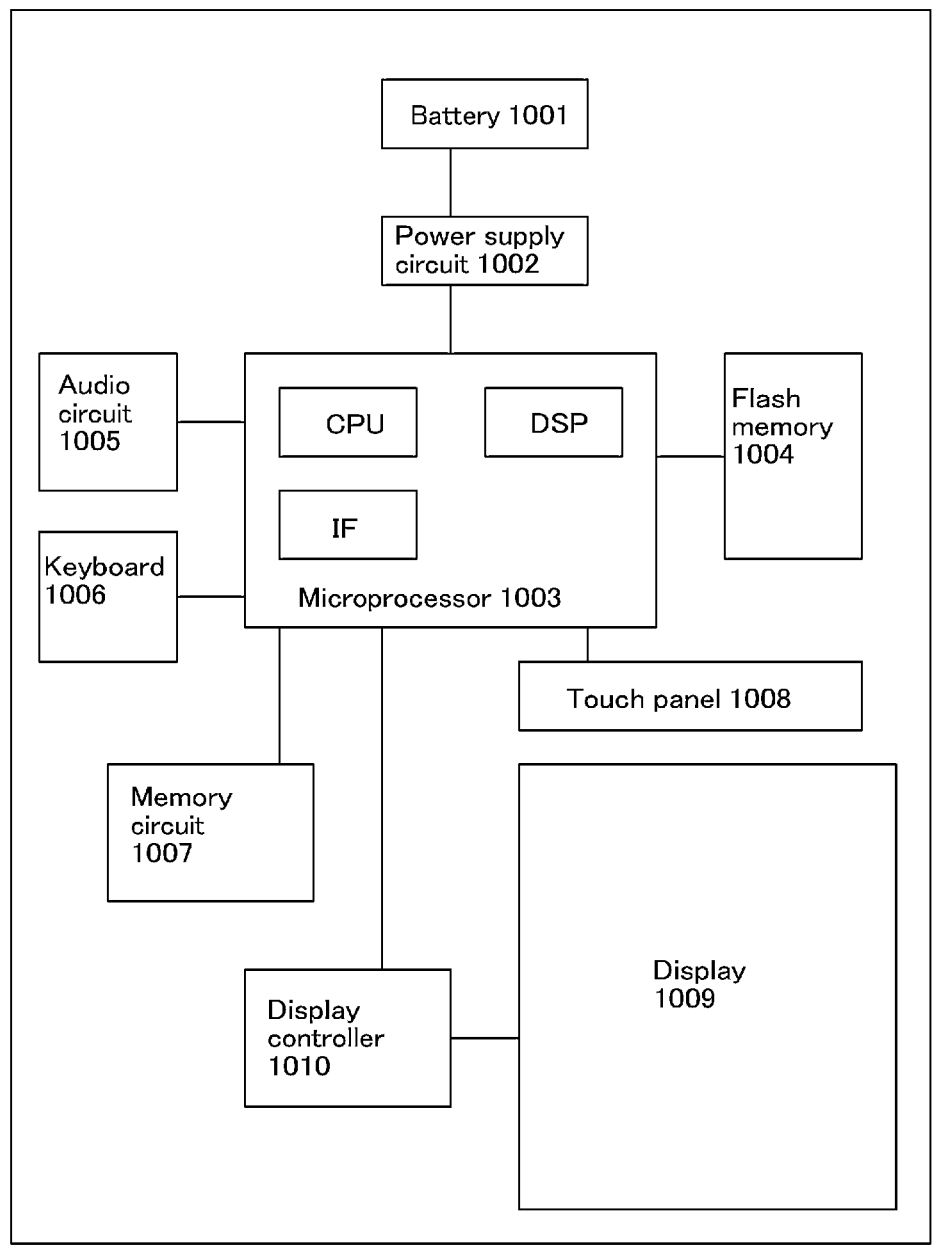
FIG. 11 is a block diagram showing one embodiment of a semiconductor device.

FIG. 11 is a block diagram of an electronic book. FIG. 11 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 11. The memory circuit 1007 has a function of temporarily storing the contents of a book. For example, users use a highlight function in some cases. When the user reads an e-book, the user will put a mark on a specific part in some cases. Such a marking function is called a highlighting function, by which characters are changed in color or type, underlined, or bold-faced, for example, so that a specific part is made to look distinct from the other part. In the function, information about the part specified by the user is stored and retained. In the case where the information is stored for a long time, the information may be copied to the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, a portable electric device in which writing and reading of data are performed at high speed, data is held for a long time, and power consumption is sufficiently reduced, can be obtained.

The structures, methods, and the like described in this embodiment can be combined as appropriate with any of the other structures, methods, and the like described in the other embodiments.

Example 1

In this example, an oxide semiconductor film (IGZO film) containing indium, gallium, and zinc was formed, ionization potentials of the oxide semiconductor film were measured, and an energy band diagram was generated according to the measurement results. In this specification, the level of the ionization potential corresponds to the sum of the band gap (energy gap) and the electron affinity, and the value of the band gap is a value obtained by measuring a single material film by spectroscopic ellipsometry. In addition, composition analysis was performed on the oxide semiconductor film.

First, the values of the band gap measured by spectroscopic ellipsometry are shown.

As a sample oxide semiconductor film, a 100-nm-thick IGZO film was formed over a quartz substrate by a sputtering method. For the deposition conditions, the substrate temperature was 300° C., and an oxide target having a composition ratio of In:Ga:Zn=3:1:2 [atomic ratio] was used.

The band gaps of the samples were about 2.8 eV to 2.9 eV: when a sample was deposited in an argon and oxygen atmosphere (argon:oxygen=30 sccm: 15 sccm) and heat treatment after the deposition was not performed, a band gap was 2.83 eV; when a sample was deposited in an argon and oxygen atmosphere (argon:oxygen=30 sccm: 15 sccm) and heat treatment was performed at 450° C. (in a nitrogen atmosphere for one hour and then in an oxygen atmosphere for one hour) after the deposition, a band gap was 2.90 eV; when a sample was deposited in an argon and oxygen atmosphere (argon:oxygen=30 sccm: 15 sccm) and heat treatment was performed at 650° C. (in a nitrogen atmosphere for one hour and then in an oxygen atmosphere for one hour) after the deposition, a band gap was 2.94 eV; when a sample was deposited in an oxygen atmosphere (the proportion of oxygen in the atmosphere is 100%) and heat treatment was not performed after the deposition, a band gap was 2.82 eV; when a sample was deposited in an oxygen atmosphere (the proportion of oxygen in the atmosphere is 100%) and heat treatment was performed at 450° C. (in a nitrogen atmosphere for one hour and then in an oxygen atmosphere for one hour) after the deposition, a band gap was 2.89 eV; when a sample was deposited in an oxygen atmosphere (the proportion of oxygen in the atmosphere is 100%) and heat treatment was performed at 650° C. (in a nitrogen atmosphere for one hour and then in an oxygen atmosphere for one hour) after the deposition, a band gap was 2.94 eV.

In addition, an IGZO film was deposited to a thickness of 15 nm by irradiating ultraviolet light from a surface side over a single-crystal silicon substrate at a substrate temperature of 300° C. in an oxygen atmosphere (the proportion of oxygen in the atmosphere is 100%) with the use of an oxide target having a composition ratio of In:Ga:Zn=3:1:2 [atomic ratio] and the ionization potential was measured by ultraviolet photoelectron spectroscopy (UPS) while the surface of the IGZO film is irradiated by ultraviolet light. Note that the ionization potential corresponds to an energy difference between a vacuum level and a valence band.

Figure 12:
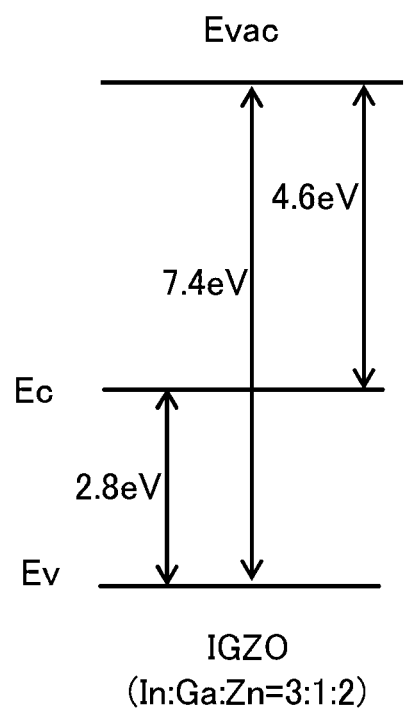
FIG. 12 is an energy band diagram of an oxide semiconductor.

The energy of the conduction band was obtained by subtracting the band gap measured by spectroscopic ellipsometry from the value of the ionization potential, and the band structure of the IGZO film which was deposited with the use of an oxide target having a composition ratio of In:Ga:Zn=3:1:2 [atomic ratio] was formed. Note that the band gap of the IGZO film was 2.8 eV. FIG. 12 shows the band gap.

Next, the composition of the IGZO film which was deposited to a thickness of 15 nm over a single-crystal silicon substrate by sputtering at a substrate temperature of 300° C. in an oxygen atmosphere (the proportion of oxygen in the atmosphere is 100%) with the use of an oxide target having a composition ratio of In:Ga:Zn=3:1:2 [atomic ratio], was evaluated by being quantified by X-ray photoelectron spectroscopy (XPS) analysis.

The IGZO film contained a 23.7 atomic % of indium (In), a 7.5 atomic % of gallium (Ga), a 9 atomic % of zinc (Zn), and a 59.7 atomic % of oxygen (O).

Further, X-ray diffraction (XRD) measurement was performed on the IGZO film deposited with the use of an oxide target having a composition ratio of In:Ga:Zn=3:1:2 [atomic ratio].

As a sample, a 100-nm-thick IGZO film was formed over a quartz substrate by a sputtering method. Deposition conditions were as follows: a substrate temperature of room temperature, 200° C., 300° C., or 400° C., an atmosphere of argon and oxygen (argon:oxygen=30 sccm: 15 sccm), and an oxide target having a composition ratio of In:Ga:Zn=3:1:2 [atomic ratio].

Figure 13:
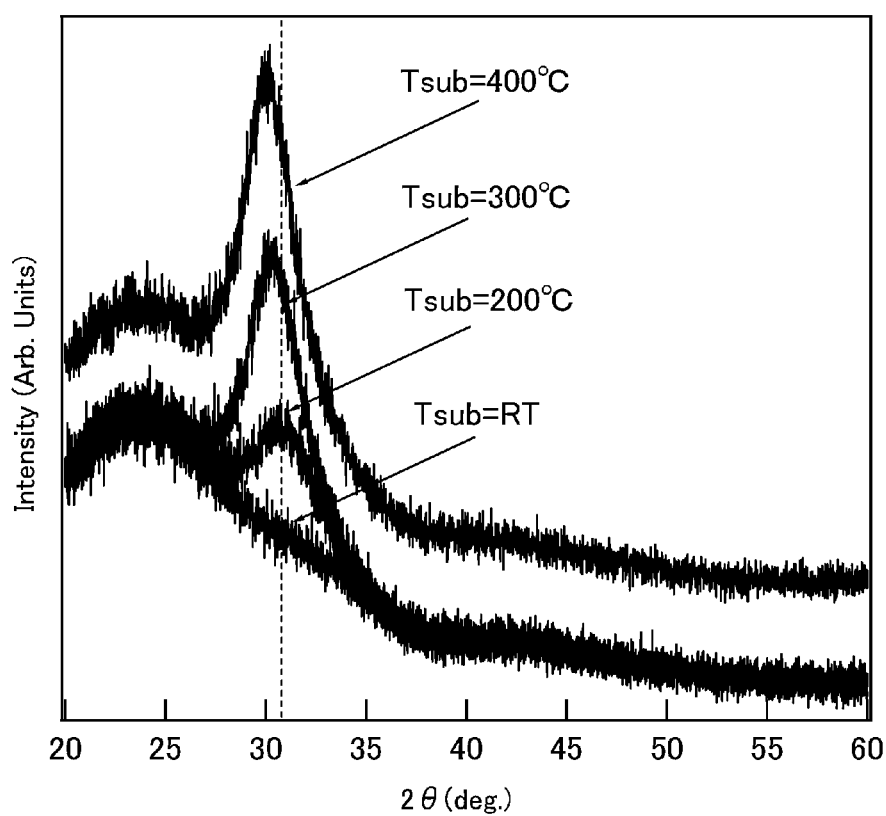
FIG. 13 is a graph showing results of XRD measurement of an oxide semiconductor film.

FIG. 13 shows measurement results of the out-of-plane XRD spectra of the IGZO films. In FIG. 13, the vertical axis indicates the X-ray diffraction intensity (arbitrary unit) and the horizontal axis indicates the rotation angle 2θ (degree). Note that the XRD spectra were measured with an X-ray diffractometer D8 ADVANCE manufactured by Bruker AXS K.K.

In the IGZO film deposited at a room temperature, a peak indicating crystallinity was not observed in the XRD spectrum as shown in FIG. 13, that is, it was confirmed that the IGZO film is an amorphous oxide semiconductor film. In addition, in each of the IGZO films deposited at 200° C., 300° C., or 400° C., a peak attributed to crystallinity was observed at around 31° (=2θ) in the XRD spectrum as shown in FIG. 13, that is, it was confirmed that the IGZO films are crystalline oxide semiconductor films.

End planes of the IGZO films were cut out, and cross sections of the IGZO films thereof were observed with a high resolution transmission electron microscope (TEM) ("H9000-NAR" manufactured by Hitachi High-Technologies Corporation) at an acceleration voltage of 300 kV.

As a sample, a 100-nm-thick IGZO film was formed over a quartz substrate by a sputtering method. Deposition conditions were as follows: a substrate temperature of 300° C., an atmosphere of argon and oxygen (argon:oxygen=30 sccm: 15 sccm), and an oxide target having a composition ratio of In:Ga:Zn=3:1:2 [atomic ratio].

Figure 16A:
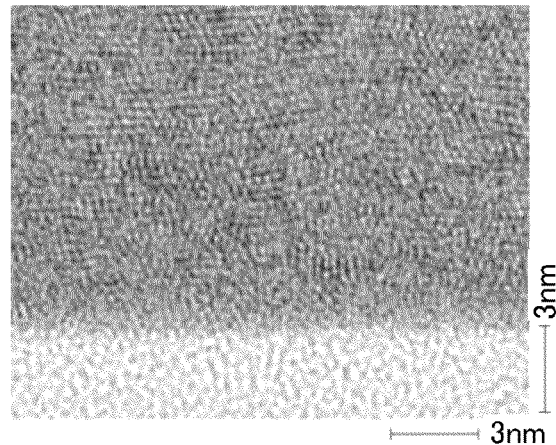
FIGS. 16A to 16C are TEM photographs of an oxide semiconductor film.
Figure 16B:
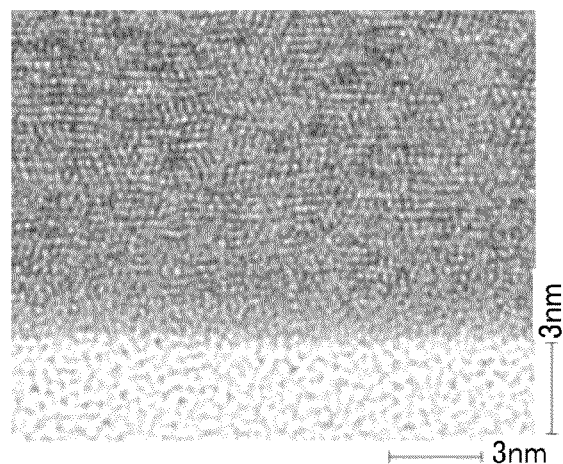
Figure 16C:
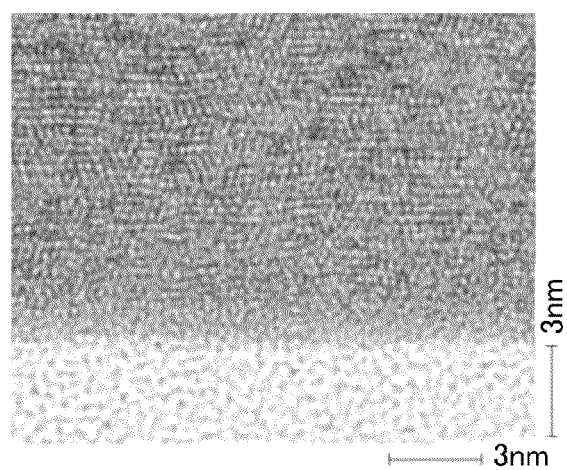

FIG. 16A is a cross-sectional TEM image of an IGZO film which is not subjected to heat treatment after deposition. FIG. 16B is a cross-sectional TEM image of an IGZO film which is subjected to heat treatment at 450° C. (in a nitrogen atmosphere for one hour and then in an oxygen atmosphere for one hour) after deposition. FIG. 16C is a cross-sectional TEM image of an IGZO film which is subjected to heat treatment at 650° C. (in a nitrogen atmosphere for one hour and then in an oxygen atmosphere for one hour) after deposition.

As shown in FIGS. 16A to 16C, crystals having a c-axis substantially perpendicular to a surface (CAAC) are confirmed in these IGZO films.

As described above, it was confirmed that a non-single crystal IGZO film is obtained with the use of an oxide target having a composition ratio of In:Ga:Zn=3:1:2 [atomic ratio].

Example 2

In this example, a transistor including an IGZO film formed with an oxide target having a composition ratio of In:Ga:Zn=3:1:2 [atomic ratio] was manufactured and electrical characteristics and reliability of the transistor were evaluated.

As the transistor, a transistor 1 having the structure of the transistor 440a in FIGS. 1A to 1E and a transistor 2 having the structure of the transistor 440b in FIG. 2A were manufactured. A method for manufacturing the transistor 1 and the transistor 2 is described below.

As an insulating layer, a 300-nm-thick silicon oxide film was deposited over a glass substrate by a sputtering method (deposition conditions: an oxygen atmosphere, a pressure of 0.4 Pa, a power of 1.5 kW, a distance between the glass substrate and a target of 60 mm, and a substrate temperature of 100° C.).

The surface of the silicon oxide film was polished and then, a 20-nm-thick IGZO film was deposited as an oxide semiconductor film, by a sputtering method with the use of an oxide target having a composition ratio of In:Ga:Zn=3:1:2 [atomic ratio]. Deposition conditions were as follows: an atmosphere of argon and oxygen (argon:oxygen=30 sccm: 15 sccm), a pressure of 0.4 Pa, a power of 1.5 kW, a distance between the glass substrate and the target of 60 mm, and a substrate temperature of 200° C.

Then, heat treatment was performed at 450° C. in a nitrogen atmosphere for one hour and then in an oxygen atmosphere for one hour. The IGZO film was processed into an island shape by an inductively coupled plasma etching (etching conditions: an etching gas of $BCl_3:Cl_2$=60 sccm: 20 sccm, a power of 450 W, a bias power of 100 W, and a pressure of 1.9 Pa).

A 50-nm-thick tungsten film was deposited by sputtering (deposition conditions: an argon atmosphere, a pressure of 0.8 Pa, and a power of 1 kW) and was etched (etching conditions: an etching gas of $CF_4:Cl_2:O_2=25$ sccm: 25 sccm: 10 sccm, a power of 500 W, a bias power of 150 W, and a pressure of 1.0 Pa) to form a source electrode layer and a drain electrode layer.

Next, a 30-nm-thick silicon oxynitride film was deposited as a gate insulating film by a CVD method.

A stack of a 15-nm-thick tantalum nitride film (deposition conditions: an atmosphere of argon and nitrogen ($Ar:N_2=50$ sccm: 10 sccm), a pressure of 0.6 Pa, and a power of 1 kW) and a 135-nm-thick tungsten film (deposition conditions: an argon atmosphere, a pressure of 2.0 Pa, and a power of 4 kW) was formed by a sputtering, and was etched (first etching conditions: an etching gas of $Cl_2:SF_6:O_2=33$ sccm: 33 sccm: 10 sccm, a power of 2000 W, a bias power of 50 W, and a pressure of 0.67 Pa; and second etching conditions: $Cl_2=100$ sccm, a power of 2000 W, a bias power of 50 W, and a pressure of 0.67 Pa), so that a gate electrode layer was formed.

Ion implantation of phosphorus (P) was performed on the IGZO film of the transistor 1 with the use of the gate electrode layer, the source electrode layer, and the drain electrode layer as masks. Note that the conditions of the phosphorus (P) ion implantation were as follows: an acceleration voltage of 40 kV and a dosage of $1.0 \times 10^{15}$ ions/$cm^2$.

As an insulating film, an aluminum oxide film was deposited over the gate electrode layer, by sputtering (deposition conditions: an atmosphere of argon and oxygen (argon:oxygen=25 sccm: 25 sccm), a pressure of 0.4 Pa, a power of 2.5 kW, a distance between the glass substrate and the target of 60 mm, and a substrate temperature of 250° C.). Then, a 300-nm-thick silicon oxynitride film was stacked over the aluminum oxide film by a CVD method.

Next, an opening reaching the IGZO film was formed in the gate insulating film and the insulating film, and a stack of a 50-nm-thick titanium film (deposition conditions: an argon atmosphere (Ar=20 sccm), a pressure of 0.1 Pa, a power of 12 kW), a 100-nm-thick aluminum film (deposition conditions: an argon atmosphere (Ar=50 sccm), a pressure of 0.4 Pa, a power of 1 kW), and a 50-nm-thick titanium film (deposition conditions: an argon atmosphere (Ar=20 sccm), a pressure of 0.1 Pa, a power of 12 kW) was formed in the opening and was etched (etching conditions: an etching gas of $BCl_3:Cl_2=60$ sccm: 20 sccm, a power of 450 W, a bias power of 100 W, and a pressure of 1.9 Pa), so that a wiring layer was formed.

Through the above process, the transistor 1 and the transistor 2 were manufactured. Note that in the transistor 1, the channel length (L) was 3.2 μm, the channel width (W) was 10.1 μm, and the width in the channel length direction (also referred to as Loff) of a region which does not overlap with the source electrode layer, the drain electrode layer, and the gate electrode layer over the oxide semiconductor film, was 0.15 μm. In the transistor 2, the channel length (L) was 2.9 μm, the channel width (W) was 10.1 μm, and the width in the channel length direction (also referred to as Lov) of a region where the source electrode layer or the drain electrode layer overlaps with the gate electrode layer over the oxide semiconductor film, was 1.15 μl.

Figure 14:
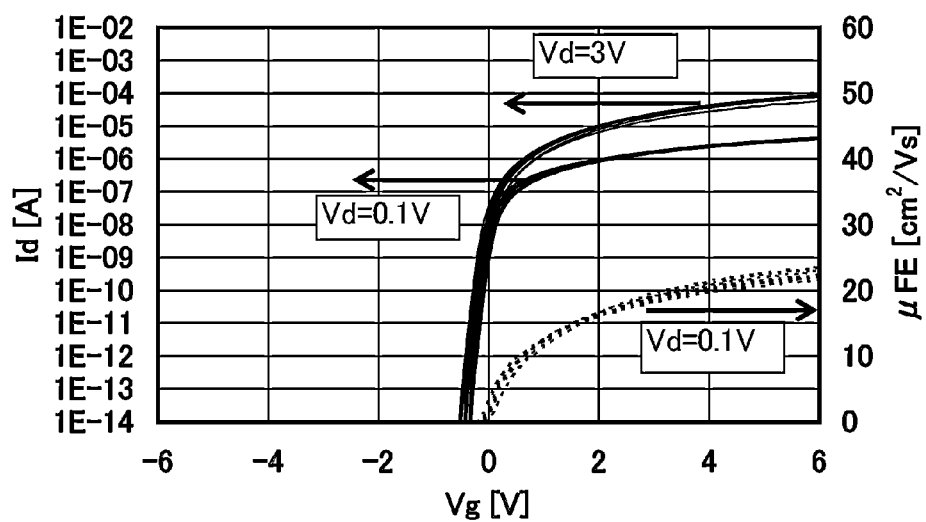
FIG. 14 is a graph showing evaluation results of electrical characteristics of a transistor 1.
Figure 15A:
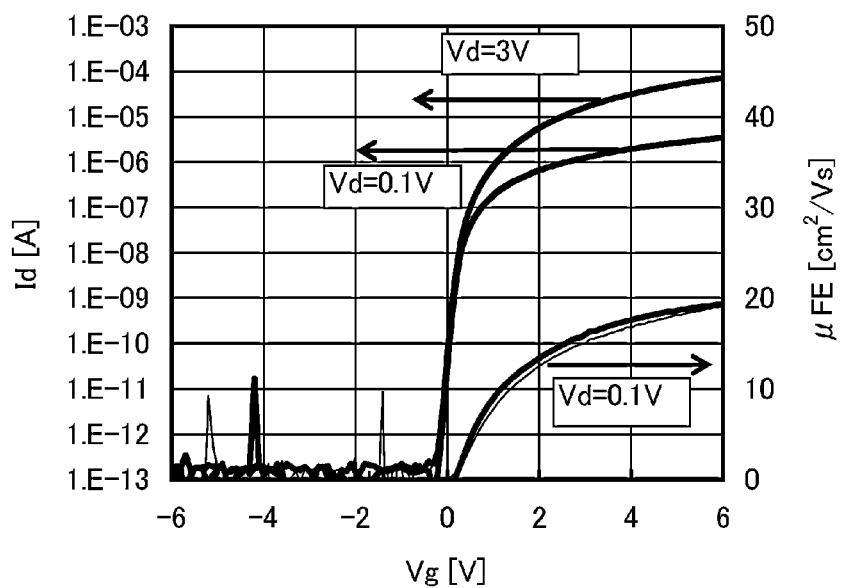
FIGS. 15A and 15B are graphs showing evaluation results of electrical characteristics and reliability of a transistor 2.
Figure 15B:
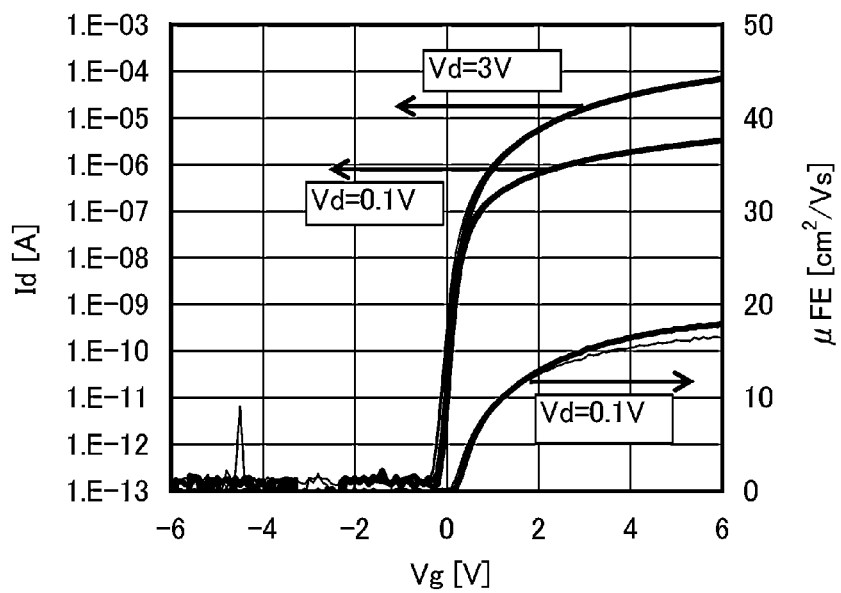

Electrical characteristics of the transistors 1 and 2 and reliability of the transistor 1 were evaluated. FIG. 14 shows gate voltage ($V_g$)-drain current ($I_d$) characteristics of the transistor 2 when drain voltages ($V_d$) are 3 V and 0.1 V and field-effect mobility when the drain voltage ($V_d$) is 0.1V. FIGS. 15A and 15B show gate voltage ($V_g$)-drain current ($I_d$) characteristics of the transistor 1 when drain voltages ($V_d$) are 3 V and 0.1 V and field-effect mobility when the drain voltage ($V_d$) is 0.1V.

As shown in FIG. 14 and FIGS. 15A and 15B, the field-effect mobility was approximately 20 $cm^2$/Vs, particularly the field-effect mobility of the transistor 2 was over 20 $cm^2$/Vs, which shows that the transistors 1 and 2 have excellent ON characteristics.

One of methods for examining reliability of transistors is a bias-temperature stress test (hereinafter, referred to as a gate bias temperature (GBT) test). The GBT test is one kind of accelerated test and a change in characteristics, caused by long-term use, of transistors can be evaluated in a short time. In particular, the amount of shift in threshold voltage of the transistor between before and after a GBT test is an important indicator for examining reliability. The smaller the shift in the threshold voltage between before and after a GBT test is, the higher the reliability of the transistor is.

The temperature of a substrate over which a transistor is formed is set at a fixed temperature. A source and a drain of the transistor are set at the same potential, and a gate is supplied with a potential different from those of the source and the drain for a certain period. The temperature of the substrate may be determined depending on the purpose of the test. Further, the potential applied to the gate is higher than the potential of the source and the drain (the potential of the source and the drain is the same) in a "+GBT test" while the potential applied to the gate is lower than the potential of the source and the drain (the potential of the source and the drain is the same) in a "−GBT test."

Strength of the GBT test may be determined based on the temperature of a substrate and electric field intensity and time period of application of the electric field to a gate insulating layer. The electric field intensity in the gate insulating layer is determined as the value of a potential difference between a gate, and a source and a drain divided by the value of the thickness of the gate insulating layer.

In this example, the GBT test was performed on the transistor 1. First, as a +GBT test, $V_g$-$I_d$ characteristics of the transistor 1 were measured at a substrate temperature of 40° C. and a drain voltage $V_d$ of 3 V. Then, the substrate temperature was set to 150° C. and $V_d$ was set to 0.1 V. After that, a gate voltage $V_g$ of 6 V was applied so that the intensity of an electric field applied to the gate insulating film was 2 MV/cm, and the condition was kept for one hour in an air. Next, $V_g$ was set to 0 V. Then, $V_g$-$I_d$ characteristics of the transistor 1 were measured at a substrate temperature of 40° C. and $V_d$ of 10 V. FIG. 15A shows results of the +GBT test.

Similarly, $V_g$-$I_d$ characteristics of the transistor 1 were measured at a substrate temperature of 40° C. and $V_d$ of 10 V. Then, the substrate temperature was set to 150° C. and $V_d$ was set to 0.1 V. After that, $V_g$ of −6 V was applied so that the intensity of an electric field applied to the gate insulating film was −2 MV/cm, and the condition was kept for one hour in an air atmosphere. Next, $V_g$ was set to 0 V. Then, $V_g$-$I_d$ characteristics of the transistor 1 were measured at a substrate temperature of 40° C. and $V_d$ of 10 V. FIG. 15B shows results of the −GBT test.

Note that in FIGS. 15A and 15B, a thick line represents results before a GBT test and a thin line represents results after the GBT test.

As shown in FIGS. 15A and 15B, the transistor 1 shows substantially no change in the threshold voltage through the +GBT test and the −GBT test. Thus, it was confirmed that the amount of changes in the threshold voltage through the +GBT test and the −GBT test is small and reliability is high in the transistor in this example.

Further, a transistor in which a channel length (L) was 0.8 μm, a channel width (W) was 1000 μm, and an Loff was 0.3 μm was manufactured by a manufacturing process similar to that of the transistor 1, and the off-state leakage current (off-state current) of the transistor was measured. The measurement was performed at 125° C. and 85° C. The measurement results are shown in FIG. 17.

Figure 17:
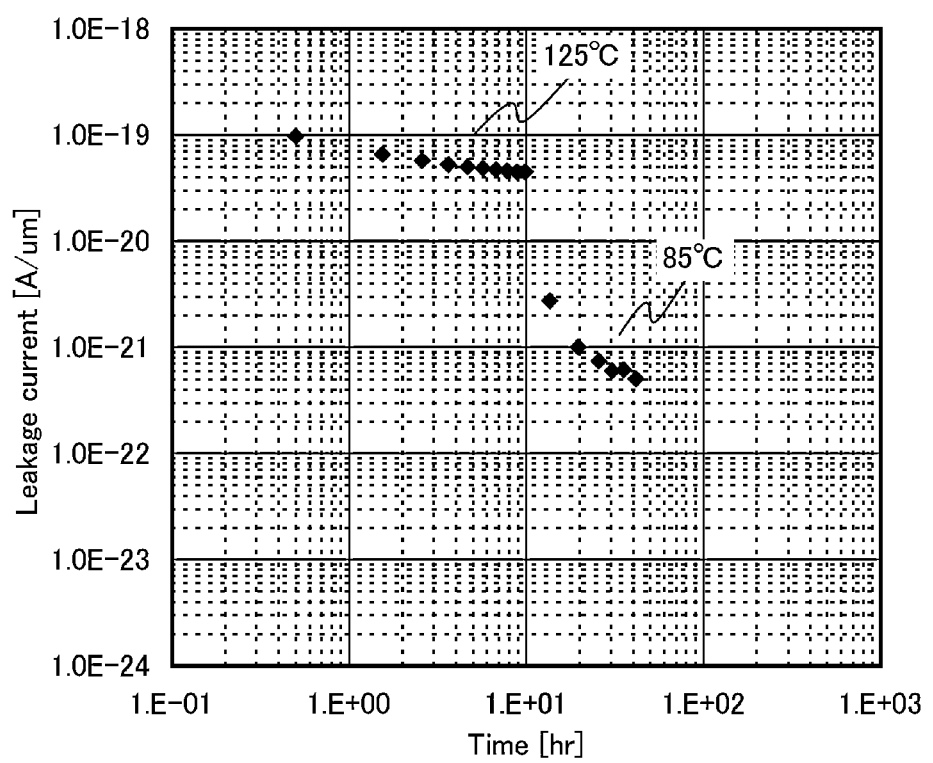
FIG. 17 is a graph showing a leakage current of a transistor.

As shown in FIG. 17, the off-leakage current when the transistor in this example was operated at 85° C. for 41.5 hours was 0.5 zA/µm, which is extremely low.

As described above, it was confirmed that the transistor in this example has an extremely low off-state current and has high reliability.

This application is based on Japanese Patent Application serial No. 2011-161383 filed with Japan Patent Office on Jul. 22, 2011, the entire contents of which are hereby incorporated by reference.

What is claimed is:

1. A semiconductor device comprising:
   an oxide semiconductor layer including a channel formation region, a first region, and a second region;
   a source electrode layer and a drain electrode layer over the oxide semiconductor layer; and
   a gate electrode layer over the oxide semiconductor layer with a gate insulating film interposed therebetween,
   wherein the first region is not overlapped with the gate electrode layer, the source electrode layer and the drain electrode layer,
   wherein the second region is overlapped with the source electrode layer or the drain electrode layer, and
   wherein a resistance in the second region is higher than a resistance in the first region.

2. The semiconductor device according to claim 1,
   wherein the first region and the second region include a dopant, and
   wherein a dopant concentration in the second region is lower than a dopant concentration in the first region.

3. The semiconductor device according to claim 1, wherein the oxide semiconductor layer includes a c-axis aligned crystal region.

4. The semiconductor device according to claim 1, wherein the oxide semiconductor layer is formed with an oxide target having a composition ratio of indium:gallium:zinc=3:1:2.

5. The semiconductor device according to claim 1, wherein a sidewall insulating layer is provided on a side surface of the gate electrode layer.

6. The semiconductor device according to claim 1, further comprising a transistor including a channel formation region comprising silicon.

7. An electronic device comprising the semiconductor device according to claim 1, wherein the electronic device includes, as a component, an LSI; a CPU; a power device mounted in a power circuit; a semiconductor integrated circuit including a memory, a thyristor, a converter, or an image sensor; an electro-optical device typified by a liquid crystal display panel; or a light-emitting display device including a light-emitting element.

8. The semiconductor device according to claim 1,
   wherein the oxide semiconductor layer contains at least four kinds of elements of indium, gallium, zinc, and oxygen, and a composition ratio of indium is twice or more that of gallium and that of zinc, and
   wherein the composition ratio is represented by atomic percentage.

9. A semiconductor device comprising:
   a pair of first oxide semiconductor layers separated from each other;
   a second oxide semiconductor layer including a channel formation region over and in contact with the pair of first oxide semiconductor layers;
   a gate electrode layer over the second oxide semiconductor layer with a gate insulating film interposed therebetween;
   a source electrode layer overlapping with one of the pair of first oxide semiconductor layers and the second oxide semiconductor layer; and
   a drain electrode layer overlapping with the other of the pair of first oxide semiconductor layers and the second oxide semiconductor layer;
   wherein the source electrode layer and the drain electrode layer are in contact with the second oxide semiconductor layer.

10. The semiconductor device according to claim 9, wherein the pair of first oxide semiconductor layers and a region of the second oxide semiconductor layer which does not overlap with the gate electrode layer include a dopant.

11. The semiconductor device according to claim 9, wherein the second oxide semiconductor layer includes a c-axis aligned crystal region.

12. The semiconductor device according to claim 9, wherein the second oxide semiconductor layer is formed with an oxide target having a composition ratio of indium:gallium:zinc=3:1:2.

13. The semiconductor device according to claim 9, wherein a sidewall insulating layer is provided on a side surface of the gate electrode layer.

14. The semiconductor device according to claim 9, further comprising a transistor including a channel formation region comprising silicon.

15. An electronic device comprising the semiconductor device according to claim 9, wherein the electronic device includes, as a component, an LSI; a CPU; a power device mounted in a power circuit; a semiconductor integrated circuit including a memory, a thyristor, a converter, or an image sensor; an electro-optical device typified by a liquid crystal display panel; or a light-emitting display device including a light-emitting element.

16. The semiconductor device according to claim 9,
   wherein the second oxide semiconductor layer contains at least four kinds of elements of indium, gallium, zinc, and oxygen, and a composition ratio of indium is twice or more that of gallium and that of zinc, and
   wherein the composition ratio is represented by atomic percentage.

17. The semiconductor device according to claim 16, wherein the pair of first oxide semiconductor layers is formed with an oxide target having a composition ratio of indium:gallium:zinc=1:1:1.

* * * * *